US012689009B2

(12) United States Patent

Toyomaki et al.

(10) Patent No.: US 12,689,009 B2

(45) Date of Patent: Jul. 21, 2026

(54) SUBSTRATE TRANSFER SYSTEM AND TRANSFER MODULE

(71) Applicant: Tokyo Electron Limited, Tokyo (JP)

(72) Inventors: Toshiaki Toyomaki, Miyagi (JP);
Norihiko Amikura, Miyagi (JP);
Seiichi Kaise, Miyagi (JP); Masatomo Kita, Miyagi (JP)

(73) Assignee: TOKYO ELECTRON LIMITED,
Tokyo (JP)

( * ) Notice: Subject to any disclaimer, the term of this patent is extended or adjusted under 35 U.S.C. 154(b) by 221 days.

(21) Appl. No.: 18/224,639

(22) Filed: Jul. 21, 2023

(65) Prior Publication Data

US 2024/0030011 A1 Jan. 25, 2024

(30) Foreign Application Priority Data

Jul. 21, 2022 (JP) ................................. 2022-116159
Jul. 4, 2023 (JP) ................................. 2023-110061

(51) Int. Cl.
*H01J 37/32* (2006.01)
*B65G 47/90* (2006.01)

(52) U.S. Cl.
CPC ........ *H01J 37/32733* (2013.01); *B65G 47/90* (2013.01); *H01J 37/32091* (2013.01)

(58) Field of Classification Search
CPC . B65G 47/90; B65G 47/902; H01L 21/67017; H01L 21/67126; H01L 21/67184; H01L 21/67196; H01L 21/67766; H01L 21/68707; H01J 37/32091; H01J 37/32733
See application file for complete search history.

(56) References Cited

U.S. PATENT DOCUMENTS

| | | | | |
|---|---|---|---|---|
| 5,913,978 A * | 6/1999 | Kato | ................... | C23C 16/4408 |
| | | | | 414/217 |
| 6,354,832 B1 * | 3/2002 | Yoshimura | ........ | H01L 21/67109 |
| | | | | 432/5 |
| 6,450,803 B2 * | 9/2002 | Shirakawa | .......... | H10P 72/0602 |
| | | | | 432/233 |
| 6,450,805 B1 * | 9/2002 | Oda | ........................ | F27D 15/02 |
| | | | | 118/724 |
| 7,503,762 B2 * | 3/2009 | Dong-Hun | .......... | H10P 72/0602 |
| | | | | 219/390 |
| 2001/0038988 A1 * | 11/2001 | Oda | .......................... | F27D 9/00 |
| | | | | 432/5 |

(Continued)

FOREIGN PATENT DOCUMENTS

JP        2021-141136 A        9/2021

*Primary Examiner* — Saul Rodriguez
*Assistant Examiner* — Brendan P Tighe
(74) *Attorney, Agent, or Firm* — XSENSUS LLP

(57) ABSTRACT

This substrate transfer system is provided with: a load-lock module; an atmospheric transfer module having a first sidewall, a second sidewall and a third sidewall, the first sidewall extending along a first direction and connected to the load-lock module, the second sidewall extending along a second direction perpendicular to the first direction, the third sidewall being disposed on an opposite side of the second sidewall; a first load port extending outward from the second sidewall along the first direction; and a second load port extending outward from the third sidewall along the first direction.

19 Claims, 19 Drawing Sheets

(56) References Cited

U.S. PATENT DOCUMENTS

| | | | | |
|---|---|---|---|---|
| 2006/0216665 A1* | 9/2006 | Fukuoka | .................... | F27B 5/04 |
| | | | | 118/58 |
| 2006/0234178 A1* | 10/2006 | Hayashi | .................... | F27B 5/04 |
| | | | | 432/198 |
| 2007/0160947 A1* | 7/2007 | Akimoto | ............. | F27B 17/0025 |
| | | | | 432/77 |
| 2019/0109031 A1* | 4/2019 | Sugawara | ......... | H01J 37/32899 |
| 2019/0265272 A1* | 8/2019 | Hyakudomi | ..... | G01R 31/31718 |
| 2020/0098609 A1* | 3/2020 | Kuwahara | ......... | H01L 21/67178 |
| 2021/0050240 A1* | 2/2021 | Moyama | ........... | H01L 21/67259 |
| 2021/0057256 A1* | 2/2021 | Bergantz | .......... | H01L 21/67201 |
| 2021/0280447 A1* | 9/2021 | Amikura | ............. | B65G 47/902 |
| 2021/0291375 A1* | 9/2021 | Bergantz | .......... | H01L 21/67742 |
| 2023/0105742 A1* | 4/2023 | Reuter | .................... | B05D 1/26 |
| | | | | 427/248.1 |

* cited by examiner

SUBSTRATE TRANSFER SYSTEM AND TRANSFER MODULE

CROSS-REFERENCE TO RELATED APPLICATIONS

This application claims priority to Japanese Patent Application Nos. 2022-116159, filed on Jul. 21, 2022, and 2023-110061, filed on Jul. 4, 2023, respectively, the entire contents of which are incorporated herein by reference.

TECHNICAL FIELD

Various aspects and embodiments of the present disclosure relate to a substrate transfer system and a transfer module.

BACKGROUND

There is known a substrate processing system including a plurality of process modules PM, a vacuum transfer module VTM, a load-lock module LLM, an equipment front end module EFEM, and a load port LP (see, e.g., Japanese Laid-open Patent Publication No. 2021-141136). Each process module PM processes a substrate using plasma or the like. The vacuum transfer module VTM transfer a substrate to the process modules PM in a low pressure environment. The load-lock module LLM performs pressure conversion between the vacuum transfer module VTM and the equipment front end module EFEM. The load port LP is disposed at the equipment front end modules EFEM and connected to a container containing a plurality of substrates. The equipment front end module EFEM transfers a substrate between the container connected to the load port LP and the load-lock module LLM.

SUMMARY

The present disclosure provides a substrate transfer system and a transfer module capable of reducing the installation area of a substrate processing system.

In accordance with an aspect of the present disclosure, there is provided a A substrate transfer system comprising: a load-lock module; an atmospheric transfer module having a first sidewall, a second sidewall and a third sidewall, the first sidewall extending along a first direction and connected to the load-lock module, the second sidewall extending along a second direction perpendicular to the first direction, the third sidewall being disposed on an opposite side of the second sidewall; a first load port extending outward from the second sidewall along the first direction; and a second load port extending outward from the third sidewall along the first direction.

BRIEF DESCRIPTION OF THE DRAWINGS

FIG. 10 is a schematic plan view showing an example of an equipment front end module EFEM and a load port LP in a third embodiment.

FIG. 14 is a schematic cross-sectional view showing an example of an XIV-XIV cross section of the equipment front end module EFEM and the load port LP illustrated in FIG. 13.

DETAILED DESCRIPTION

Hereinafter, embodiments of a substrate transfer system and a transfer module will be described in detail with reference to the accompanying drawings. The following embodiments are not intended to limit the substrate transfer system and the transfer module of the present disclosure.

In order to increase the number of substrates that can be processed per unit time, it is considered to increase the number of process modules PM with respect to the number of substrates. The increase in the number of process modules PM leads to the scaling up of the substrate processing system including the process modules PM, the vacuum transfer module VTM, the load-lock module LLM, the equipment front end module EFEM, and the like. The scaling up of the substrate processing system leads to a large installation area (footprint) of the substrate processing system in equipment such as a clean room or the like, which makes it difficult to arrange a plurality of substrate processing systems.

Therefore, it is desired to reduce the installation area of the substrate processing system.

Accordingly, the present disclosure provides a technique capable of reducing the installation area of the substrate processing system.

First Embodiment

[Configuration of Substrate Processing System 1]

Figure 1:
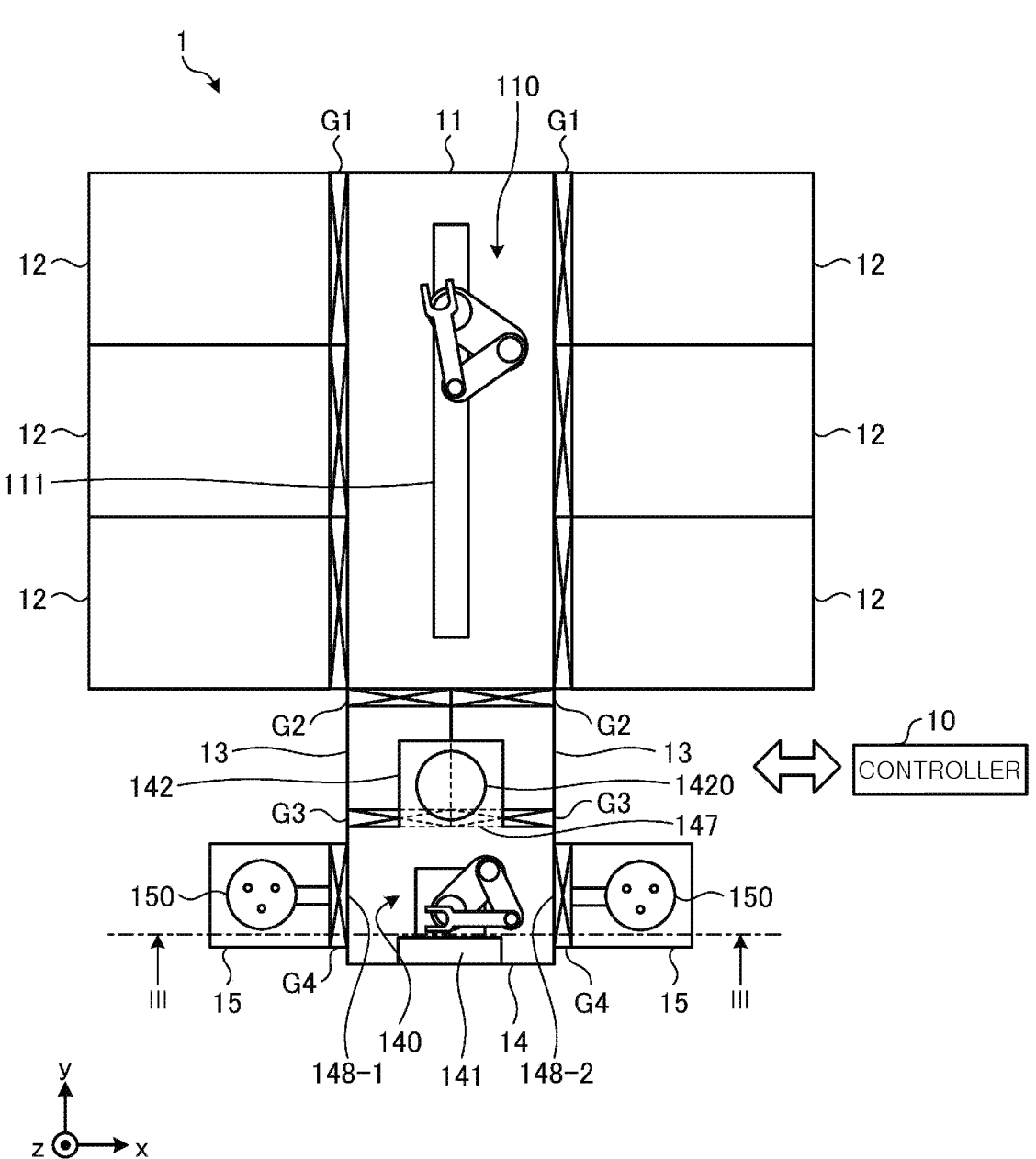
FIG. 1 is a schematic plan view showing an example of a substrate processing system according to a first embodiment.

FIG. 1 is a plan view showing an example of a configuration of a substrate processing system 1 according to a first embodiment. In FIG. 1, some internal components of the apparatus are illustrated transparently for easier understanding. The substrate processing system 1 includes a vacuum transfer module VTM 11, multiple process modules PM 12, multiple load-lock modules LLM 13, and an equipment front end module EFEM 14. The equipment front end module EFEM 14 is an example of a transfer module. In the example of FIG. 1, the vacuum transfer module VTM 11, the load-lock modules LLM 13, and the equipment front end module EFEM 14 are arranged side by side along the Y-axis direction of FIG. 1.

The process modules PM 12 are connected to the sidewall of the vacuum transfer module VTM 11 via gate valves G1. Each process module PM 12 performs processing such as etching, film formation, or the like on a substrate W to be processed. In the example of FIG. 1, six process modules PM 12 are connected to the vacuum transfer module VTM 11. However, the number of process modules PM 12 connected to the vacuum transfer module VTM 11 may be more than six or less than six.

Figure 2:
FIG. 2 is a schematic cross-sectional view showing an example of a process module PM.

FIG. 2 is a schematic cross-sectional view showing an example of the process module PM. In the present embodiment, the process module PM 12 is, for example, a capacitively coupled plasma processing apparatus. The process module PM 12 includes a plasma processing chamber 120, a gas supply 124, a power supply 125, and an exhaust system 128. The process module PM 12 further includes a substrate support 121 and a gas inlet portion. The gas inlet portion is configured to introduce at least one processing gas into the plasma processing chamber 120. The gas inlet portion includes a shower head 123. The substrate support 121 is disposed in the plasma processing chamber 120. The shower head 123 is disposed above the substrate support 121. In one embodiment, the shower head 123 forms at least a part of a ceiling of plasma processing chamber 120. The plasma processing chamber 120 has a plasma processing space 120s defined by the shower head 123, a sidewall 120a of the plasma processing chamber 120 and the substrate support 121. The plasma processing chamber 120 has at least one gas supply port for supplying at least one processing gas to the plasma processing space 120s and at least one gas exhaust port for exhausting a gas from the plasma processing space 120s. The plasma processing chamber 120 is grounded. The shower head 123 and the substrate support 121 are electrically insulated from the housing of the plasma processing chamber 120. An opening 120b for loading and unloading the substrate W is formed at the sidewall 120a of the plasma processing chamber 120. The opening 120b is opened and closed by a gate valve G1.

The substrate support 121 includes a main body 1211 and a ring assembly 1212. The main body 1211 has a central region 1211a for supporting a substrate W and an annular region 1211b for supporting the ring assembly 1212. A wafer is an example of the substrate W. The annular region 1211b of the main body 1211 surrounds the central region 1211a of the main body 1211 in plan view. The substrate W is disposed on the central region 1211a of the main body 1211, and the ring assembly 1212 is placed on the annular region 1211b of the main body 1211 to surround the substrate W disposed the central region 1211a of the main body 1211. The central region 1211a is also referred to as "substrate supporting surface" for supporting the substrate W and the annular region 1211b is also referred to as "ring supporting surface" for supporting the ring assembly 1212.

In one embodiment, the main body 1211 includes a base 12110 and an electrostatic chuck 12111. The base 12110 includes a conductive member. The conductive member of the base 12110 can function as a lower electrode. The electrostatic chuck 12111 is disposed on the base 12110. The electrostatic chuck 12111 includes a ceramic member 12111a and an electrostatic electrode 12111b embedded in the ceramic member 12111a. The ceramic member 12111a has the central region 1211a. In one embodiment, the ceramic member 12111a also has the annular region 1211b. Another member surrounding the electrostatic chuck 12111, such as an annular electrostatic chuck or an annular insulating member, may have the annular region 1211b. In this case, the ring assembly 1212 may be disposed on the annular electrostatic chuck or the annular insulating member, or may be disposed on both the electrostatic chuck and the annular insulating member. At least one radio frequency (RF)/direct current (DC) electrode coupled to an RF power supply 126 and/or a DC power supply 127, which will be described later, may be disposed in the ceramic member 12111a. In this case, at least one RF/DC electrode functions as the lower electrode. When a bias RF signal and/or a DC signal, which will be described later, is supplied to at least one RF/DC electrode, the RF/DC electrode is also referred to as "bias electrode." The conductive member of the base 12110 and at least one RF/DC electrode may function as multiple lower electrodes. The electrostatic electrode 12111b may function as the lower electrode. The substrate support 121 includes at least one lower electrode.

The ring assembly 1212 includes one or multiple annular members. In one embodiment, one or multiple annular members include one or multiple edge rings and at least one cover ring. The edge ring is made of a conductive material or an insulating material, and the cover ring is made of an insulating material.

The substrate support 121 may include a temperature control module configured to adjust at least one of the electrostatic chuck 12111, the ring assembly 1212, and the substrate W to a target temperature. The temperature control module may include a heater, a heat transfer medium, a channel 12110a, or a combination thereof. A heat transfer fluid, such as brine or gas, flows through the channel 12110a. In one embodiment, the channel 12110a is formed in the base 12110 and one or more heaters are disposed in the ceramic member 12111a of the electrostatic chuck 12111. Further, the substrate support 121 may include a heat transfer gas supply configured to supply a heat transfer gas to the gap between the backside of the substrate W and the central region 1211a.

The shower head 123 is configured to introduce at least one processing gas from the gas supply 124 into the plasma processing space 120s. The shower head 123 has at least one gas supply port 123a, at least one gas diffusion space 123b, and multiple gas inlet ports 123c. The processing gas supplied to the gas supply port 123a passes through the gas diffusion space 123b and is introduced into the plasma processing space 120s from the gas inlet ports 123c. The shower head 123 includes at least one upper electrode. An upper electrode plate may be detachably disposed on the bottom surface of the shower head 123. The gas inlet portion may include, in addition to the shower head 123, one or more side gas injectors (SGI) attached to one or more openings formed in the sidewall 120a.

The gas supply 124 may include at least one gas source 1240 and at least one flow rate controller 1241. In one embodiment, the gas supply 124 is configured to supply at least one processing gas from the corresponding gas source 1240 to the shower head 123 through the corresponding flow rate controller 1241. The flow rate controllers 1241 may include, for example, a mass flow controller or a pressure-controlled flow rate controller. Further, the gas supply 124 may include one or more flow rate modulation devices for modulating the flow rate of at least one processing gas or causing it to pulsate.

The power supply 125 includes an RF power supply 126 connected to the plasma processing chamber 120 through at least one impedance matching circuit. The RF power supply 126 is configured to supply at least one RF signal (RF power) to at least one lower electrode and/or at least one upper electrode. Accordingly, plasma is produced from at least one processing gas supplied to the plasma processing space 120s. Therefore, the RF power supply 126 may function as at least a part of a plasma generator configured to generate plasma from one or more processing gases in the plasma processing chamber 120. Further, by supplying the bias RF signal to at least one lower electrode, a bias potential is generated at the substrate W, and ions in the produced plasma can be attracted to the substrate W.

In one embodiment, the RF power supply 1261 includes a first RF generator 126a and a second RF generator 126b. The first RF generator 126a is connected to at least one lower electrode and/or at least one upper electrode through at least one impedance matching circuit to generate a source RF signal (source RF power) for plasma generation. In one embodiment, the source RF signal has a frequency within a range of 10 MHz to 150 MHz. In one embodiment, the first RF generator 126a may be configured to generate multiple source RF signals having different frequencies. The generated single or multiple source RF signals are supplied to at least one lower electrode and/or at least one upper electrode.

The second RF generator 126b is connected to at least one lower electrode through at least one impedance matching circuit, and is configured to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency within a range of 100 kHz to 60 MHz. In one embodiment, the second RF generator 126b may be configured to generate multiple bias RF signals having different frequencies. The generated single or multiple bias RF signals are supplied to at least one lower electrode. Further, in various embodiments, at least one of the source RF signal and the bias RF signal may pulsate.

Further, the power supply 125 may include a DC power supply 127 connected to the plasma processing chamber 120. The DC power supply 127 includes a first DC generator 127a and a second DC generator 127b. In one embodiment, the first DC generator 127a is connected to at least one lower electrode, and is configured to generate a first DC signal. The generated first bias DC signal is applied to at least one lower electrode. In one embodiment, the second DC generator 127b is connected to at least one upper electrode, and is configured to generate a second DC signal. The generated second DC signal is applied to at least one upper electrode. In various embodiments, at least one of the first and second DC signals may pulsate. In this case, a sequence of voltage pulses is applied to at least one lower electrode and/or at least one upper electrode. The voltage pulse may have a rectangular pulse waveform, a trapezoidal pulse waveform, a triangular pulse waveform, or a combination thereof. In one embodiment, a waveform generator for generating a sequence of voltage pulses from the DC signal is connected between the first DC generator 127a and at least one lower electrode. Therefore, the first DC generator 127a and the waveform generator constitute a voltage pulse generator. When the second DC generator 127b and the waveform generator constitute the voltage pulse generator, the voltage pulse generator is connected to at least one upper electrode. The voltage pulse may have positive polarity or negative polarity. Further, the sequence of voltage pulses may include one or more positive voltage pulses and one or more negative voltage pulses in one cycle. The first DC generator 127a and the second DC generator 127b may be provided in addition to the RF power supply 126. The first DC generator 127a may be provided instead of the second RF generator 126b.

The exhaust system 128 may be connected to a gas outlet 120e disposed at a bottom portion of plasma processing chamber 120, for example. The exhaust system 128 may include a pressure control valve and a vacuum pump. The pressure control valve adjusts a pressure in the plasma processing space 120s. The vacuum pump may include a turbo molecular pump, a dry pump, or a combination thereof.

Referring back to FIG. 1, the load-lock modules LLM 13 are connected to another sidewall of the vacuum transfer module VTM 11 through gate valves G2. Although two load-lock modules LLM 13 are connected to the vacuum transfer module VTM 11 in the example of FIG. 1, the number of load-lock modules LLM 13 connected to the vacuum transfer module VTM 11 may be more than two or less than two.

A transfer robot 110 is disposed in the vacuum transfer module VTM 11. The transfer robot 110 moves in the vacuum transfer module VTM 11 along a guide rail 111 disposed in the vacuum transfer module VTM 11, and transfers a substrate W between the process module PM 12 and the load-lock module LLM 13. The substrate W is an example of an object to be transferred. The transfer robot 110 may be fixed to a predetermined position in the vacuum transfer module VTM 11, and may not move in the vacuum transfer module VTM 11. The pressure in the vacuum transfer module VTM 11 is maintained in a pressure atmosphere lower than an atmospheric pressure.

The vacuum transfer module VTM 11 is connected to one sidewall of each load-lock module LLM 13 through a gate valve G2, and the equipment front end module EFEM 14 is connected to another sidewall thereof through a gate valve G3. When the substrate W is transferred from the equipment front end module EFEM 14 into the load-lock module LLM 13 through the gate valve G3, the gate valve G3 is closed. Then, the pressure in the load-lock module LLM 13 is lowered from a predetermined first pressure (for example, atmospheric pressure) to a predetermined second pressure (for example, predetermined vacuum level). Then, the gate valve G2 is opened, and the substrate W in the load-lock module LLM 13 is transferred into the vacuum transfer module VTM 11 by the transfer robot 110.

In a state where the pressure in the load-lock module LLM 13 is maintained at the second pressure, the substrate W is transferred from the vacuum transfer module VTM 11 into the load-lock module LLM 13 through the gate valve G2 by the transfer robot 110, and the gate valve G2 is closed. Then, the pressure in the load-lock module LLM 13 is increased from the second pressure to the first pressure. Then, the gate valve G3 is opened, and the substrate W in the load-lock module LLM 13 is transferred into the equipment front end module EFEM 14.

The equipment front end module EFEM 14 has sidewalls 147, 148-1, and 148-2. A plurality of load ports LP 15 are disposed at the sidewalls 148-1 and 148-2 of the equipment front end module EFEM 14 that are different from the sidewall 147 of the equipment front end module EFEM 14 to which the load-lock modules LLM 13 are connected. In the example of FIG. 1, the sidewall 147 extends along the X-axis direction, and is connected to the load-lock modules 13. The sidewall 148-1 extends along the Y-axis direction perpendicular to the X-axis direction. The sidewall 148-2 is disposed at the opposite side of the sidewall 148-1. The load port 15 extending outward from the sidewall 148-1 along the X-axis direction is disposed at the sidewall 148-1. The load port 15 extending outward from the sidewall 148-2 along the X-axis direction is disposed at the sidewall 148-2.

The sidewall 147 is an example of a first sidewall. The sidewall 148-1 is an example of a second sidewall. The sidewall 148-2 is an example of a third sidewall. Further, the load port 15 disposed at the sidewall 148-1 is an example of a first load port, and the load port 15 disposed at the sidewall 148-2 is an example of a second load port. Further, the X-axis direction is an example of a first direction, and the Y-axis direction is an example of a second direction.

Each load port LP 15 is provided with a moving part 150 on which a container such as a front opening unified pod (FOUP) or the like capable of accommodating a plurality of substrates W is placed. The moving part 150 disposed at the sidewall 148-1 is an example of a first substrate carrier stage, and the moving part 150 disposed at the sidewall 148-2 is an example of a second substrate carrier stage. The container such as the FOUP or the like is transferred by a container transfer mechanism, for example, an overhead hoist transport (OHT) or the like, and is placed on the moving part 150.

In the present embodiment, the load ports LP 15 are disposed at the second sidewalls 148-1 and 148-2 which are different from the sidewall opposite to the sidewall 147 of the equipment front end module EFEM 14 to which the load-lock modules LLM 13 are connected. Accordingly, the length of the substrate processing system 1 along the Y-axis direction can be shortened compared to the case where the load ports LP 15 are disposed at the sidewall facing the sidewall 147. Hence, the installation area of the substrate processing system 1 can be reduced.

A transfer robot 140 is disposed in the equipment front end module EFEM 14. The transfer robot 140 is an example of a transfer device. Further, an alignment chamber 142 is disposed in the equipment front end module EFEM 14. An aligner unit 1420 for adjusting the direction of the substrate W is disposed in the alignment chamber 142. The transfer robot 140 moves vertically in the equipment front end module EFEM 14 along guide rail 141 disposed in the equipment front end module EFEM 14 to transfer the substrate W between the container set in the load port LP 15, the alignment chamber 142 and the load-lock module LLM 13. Further, the transfer robot 140 may be fixed to a predetermined position in the equipment front end module EFEM 14, and may not move in the equipment front end module EFEM 14.

In the present embodiment, the equipment front end module EFEM 14 is maintained in an airtight state, and an inert gas such as a rare gas or a nitrogen gas is supplied from a gas supply (not shown) into the equipment front end module EFEM 14 and circulates therein. A fan filter unit FFU is disposed above the equipment front end module EFEM 14. An inert gas from which particles and the like are removed is supplied from above into the equipment front end module EFEM 14, thereby forming a downflow in the equipment front end module EFEM 14. In the present embodiment, the pressure in the equipment front end module EFEM 14 is an atmospheric pressure. However, in another embodiment, the pressure in the equipment front end module EFEM 14 may be controlled to a positive pressure. Accordingly, it is possible to suppress particles and the like from entering the equipment front end module EFEM 14 from the outside.

The substrate processing system 1 is controlled by a controller 10. The controller 10 has a memory, a processor, and an input/output interface. Programs or data such as recipes and the like are stored in the memory. The memory is, for example, a random access memory (RAM), a read only memory (ROM), a hard disk drive (HDD) or a solid state drive (SSD), or the like. The processor executes programs read from the memory, thereby controlling the individual components of the substrate processing system 1 through the input/output interface based on the data such as the recipes and the like stored in the memory. The processor is a central processing unit (CPU), a digital signal process (DSP), or the like.

[Specific Description of Equipment Front End Module EFEM 14 and Load Port LP 15]

Figure 3:
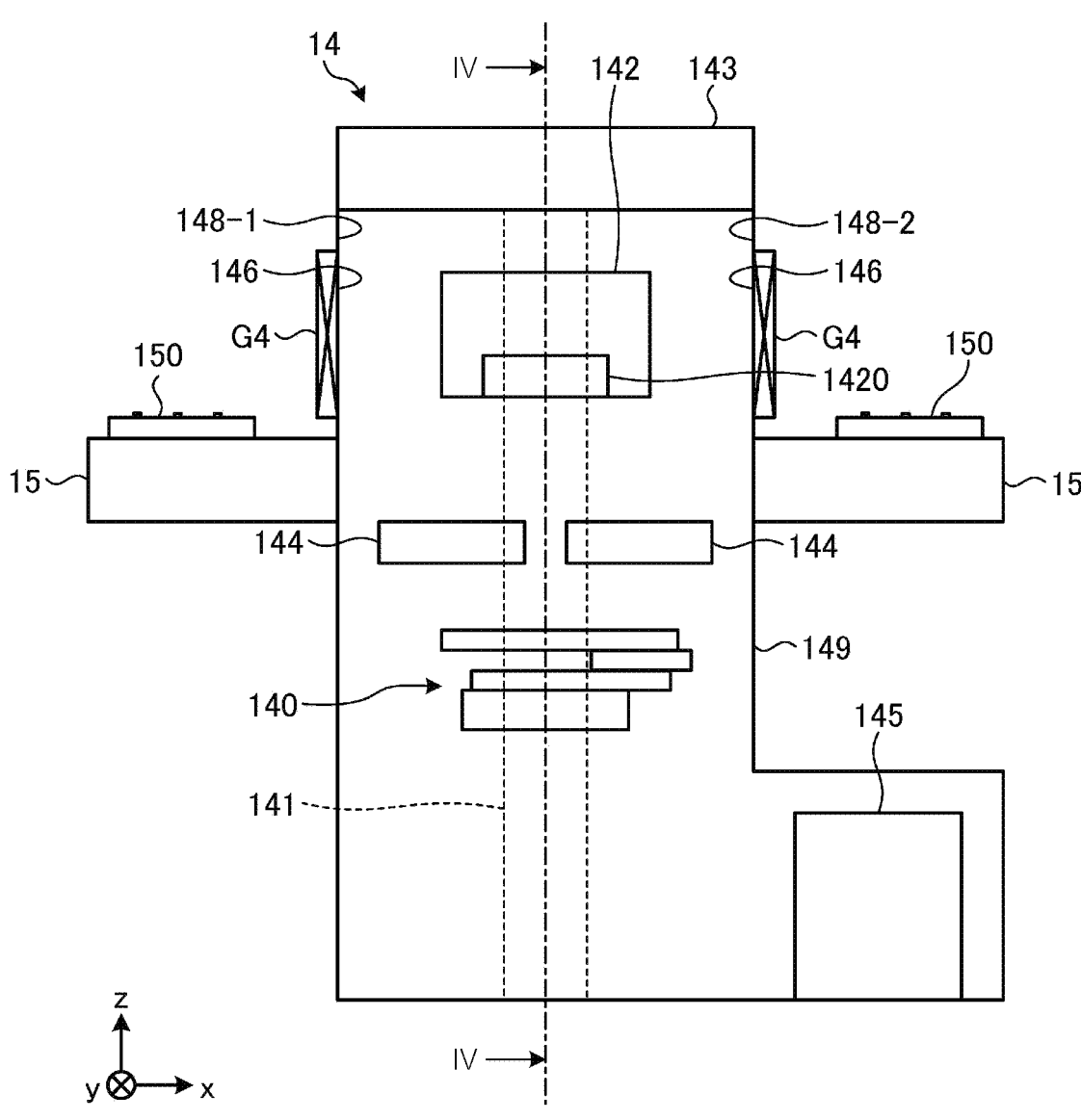
FIG. 3 is a schematic cross-sectional view showing an example of an cross section of an equipment front end module EFEM and a load port LP illustrated in FIG. 1.
Figure 4:
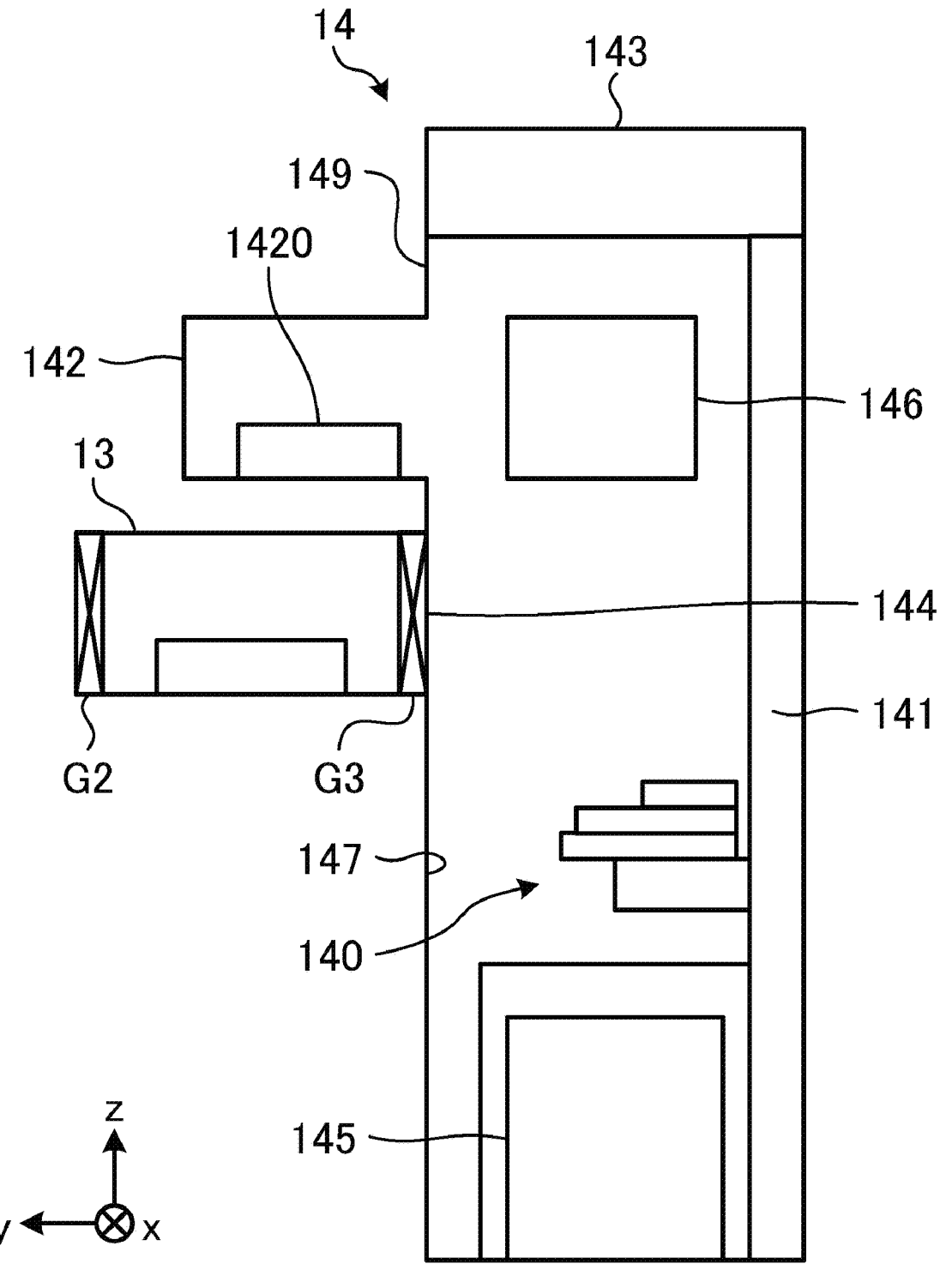
FIG. 4 is a schematic cross-sectional view showing an example of a IV-IV cross section of the equipment front end module EFEM illustrated in FIG. 3.

FIG. 3 is a schematic cross-sectional view showing an example of an III-III cross section of the equipment front end module EFEM 14 and the load port LP 15 illustrated in FIG. 1. FIG. 4 is a schematic cross section showing an example of a IV-IV cross section of the equipment front end module EFEM 14 illustrated in FIG. 3. In FIG. 3, the guide rail 141 is also illustrated.

The equipment front end module EFEM 14 has a housing 149. As shown in FIGS. 3 and 4, the alignment chamber 142 is disposed in the equipment front end module EFEM 14, and the aligner unit 1420 is disposed in the alignment chamber 142. A fan filter unit FFU 143 is disposed above the equipment front end module EFEM 14. An opening 144 communicating with the load-lock module LLM 13 is formed in the sidewall 147 of the equipment front end module EFEM 14 to which the load-lock modules LLM 13 are connected. The opening 144 is an example of a first opening. The aligner unit 1420 is disposed above the load-lock module LLM 13 as shown in FIG. 4, for example.

The guide rail 141 is formed on a sidewall facing the sidewall 147 of the equipment front end module EFEM 14 where the openings 144 are formed to extend vertically along the sidewall. The transfer robot 140 moves vertically along the guide rail 141 in the equipment front end module EFEM 14. A storage unit 145 is disposed below the equipment front end module EFEM 14 to temporarily store substrates W before and after processing.

As shown in FIGS. 3 and 4, for example, an opening 146 connected to the container placed on the load port 15 is formed in the second sidewalls 148-1 and 148-2 different from the sidewall facing the sidewall 147 having the openings 144 to which the load-lock modules LLM 13 is connected. The opening 146 is an example of a second opening.

[Operation of Load Port LP 15]

Figure 5A:
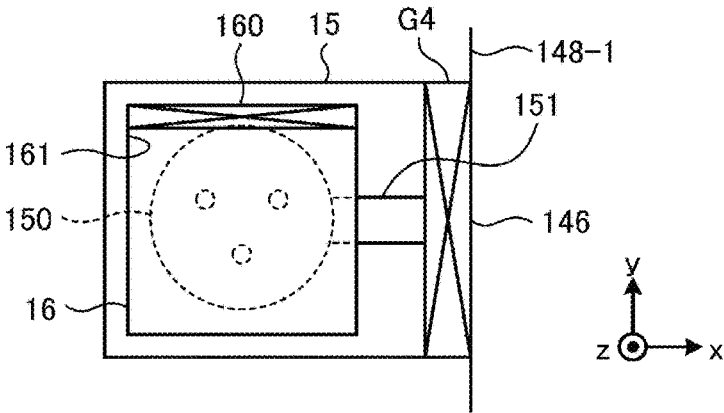
FIGS. 5A to 5C show an example of a process in which a container placed on a moving part of the load port LP is connected to the equipment front end module EFEM.
Figure 5B:
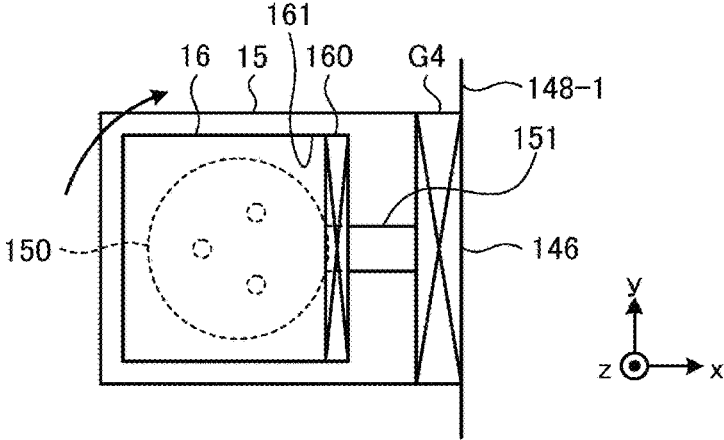
Figure 5C:
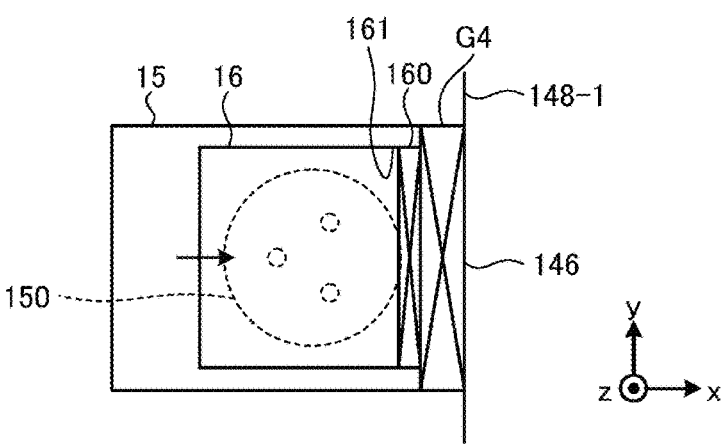

FIGS. 5A to 5C show an example of a process in which the container 16 placed on the moving part 150 of the load port LP 15 is connected to the equipment front end module EFEM 14. In FIGS. 5A to 5C, the load port LP 15 connected to the sidewall 148-1 is illustrated.

A container 16 such as a FOUP containing a plurality of substrates W is transferred by, for example, a transfer mechanism such as an OHT or the like, and is placed on the moving part 150. For example, as shown in FIG. 5A, the container 16 is placed on the moving part 150 such that the surface of an opening 161 where a door 160 is provided along the sidewall surface facing the sidewall 147 of the equipment front end module EFEM 14 (along the X-axis direction in the example of FIG. 5A). The opening 161 of the container 16 is an example of a first opening.

Next, as shown in FIG. 5B, for example, the moving part 150 changes the direction of the container 16 such that the surface of the opening 161 is provided along the sidewall 148-1 of the equipment front end module EFEM 14 (along the Y-axis direction in the example of FIG. 5B).

Next, as shown in FIG. 5C, for example, the moving part 150 moves on the guide rail 151 to move the container 16 so that the opening 161 of the container 16 and the opening 146 formed in the sidewall 147 of the equipment front end module EFEM 14 become close. Thereafter, the container 16 and the equipment front end module EFEM 14 are connected by opening the door 160 and the gate valve G4.

The first embodiment has been described above. As described above, the equipment front end module EFEM 14 in the present embodiment includes the housing 149, and the transfer robot 140 disposed in the housing 149 to transfer a substrate W that is an example of an object to be transferred. The housing 149 has the sidewall 147 having the openings 144 communicating with the load-lock chambers LLM 13, and the sidewall 148-1 different from the sidewall facing the sidewall 147. The sidewall 148-1 is connected to the load port 15, and has at least one opening 146. Accordingly, the installation area of the substrate processing system 1 can be reduced.

Further, in the above-described embodiment, the load port LP 15 has the moving part 150. The moving part 150 changes the position and the direction of the container 16, which is disposed such that the surface of the container 16 in which the opening 161 is formed is provided along the sidewall surface facing the sidewall 147 of the equipment front end module EFEM 14 by the container transfer mechanism for transferring the container 16, such that the opening 161 of the container 16 and the opening 146 of the sidewall 148-1 communicate with each other. Accordingly, the container 16 transferred by the container transfer mechanism can be connected to the equipment front end module EFEM 14.

Further, in the above-described embodiment, the equipment front end module EFEM 14 has the aligner unit 1420 disposed in the housing 149. Accordingly, the space in the equipment front end module EFEM 14 can be effectively utilized.

Further, in the above-described embodiment, the equipment front end module EFEM 14 has the storage unit 145 disposed in the housing 149. Accordingly, the space in the equipment front end module EFEM 14 can be effectively utilized.

Further, in the above-described embodiment, the equipment front end module EFEM 14 further has a gas supply for supplying and circulating an inert gas in the housing 149. Accordingly, the quality deterioration, such as oxidation or the like, of the substrate W passing through the equipment front end module EFEM 14 can be suppressed.

Second Embodiment

In the first embodiment, one container 16 is connected to each of the sidewalls 148-1 and 148-2 of the equipment front end module EFEM 14. The present embodiment is different from the first embodiment in that multiple containers 16 are connected to each of the sidewalls 148-1 and 148-2 of the equipment front end module EFEM 14. Hereinafter, the differences between the first embodiment and the present embodiment will be mainly described.

Figure 6:
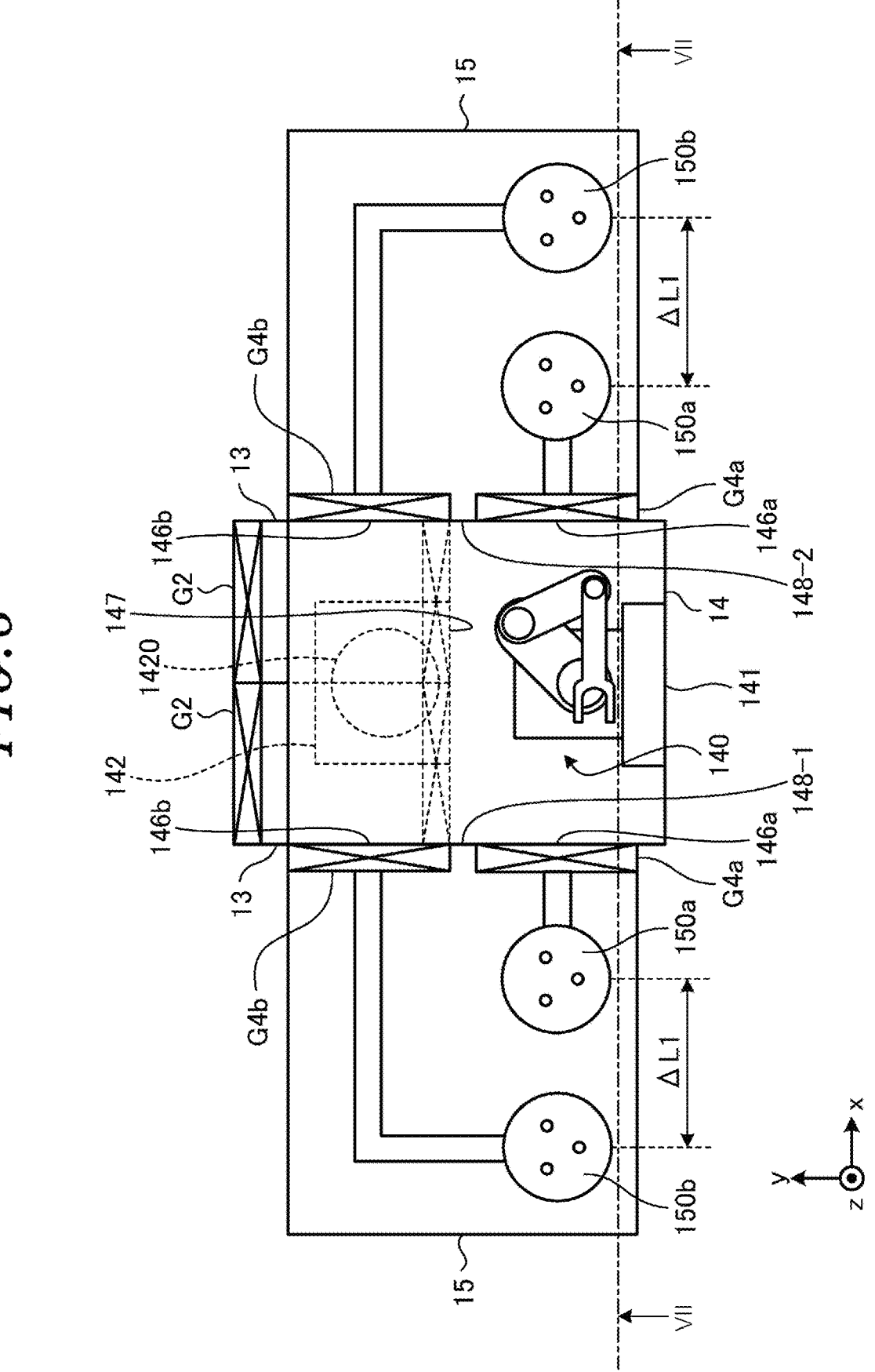
FIG. 6 is a schematic plan view showing an example of an equipment front end module EFEM and a load port LP in a second embodiment.
Figure 7:
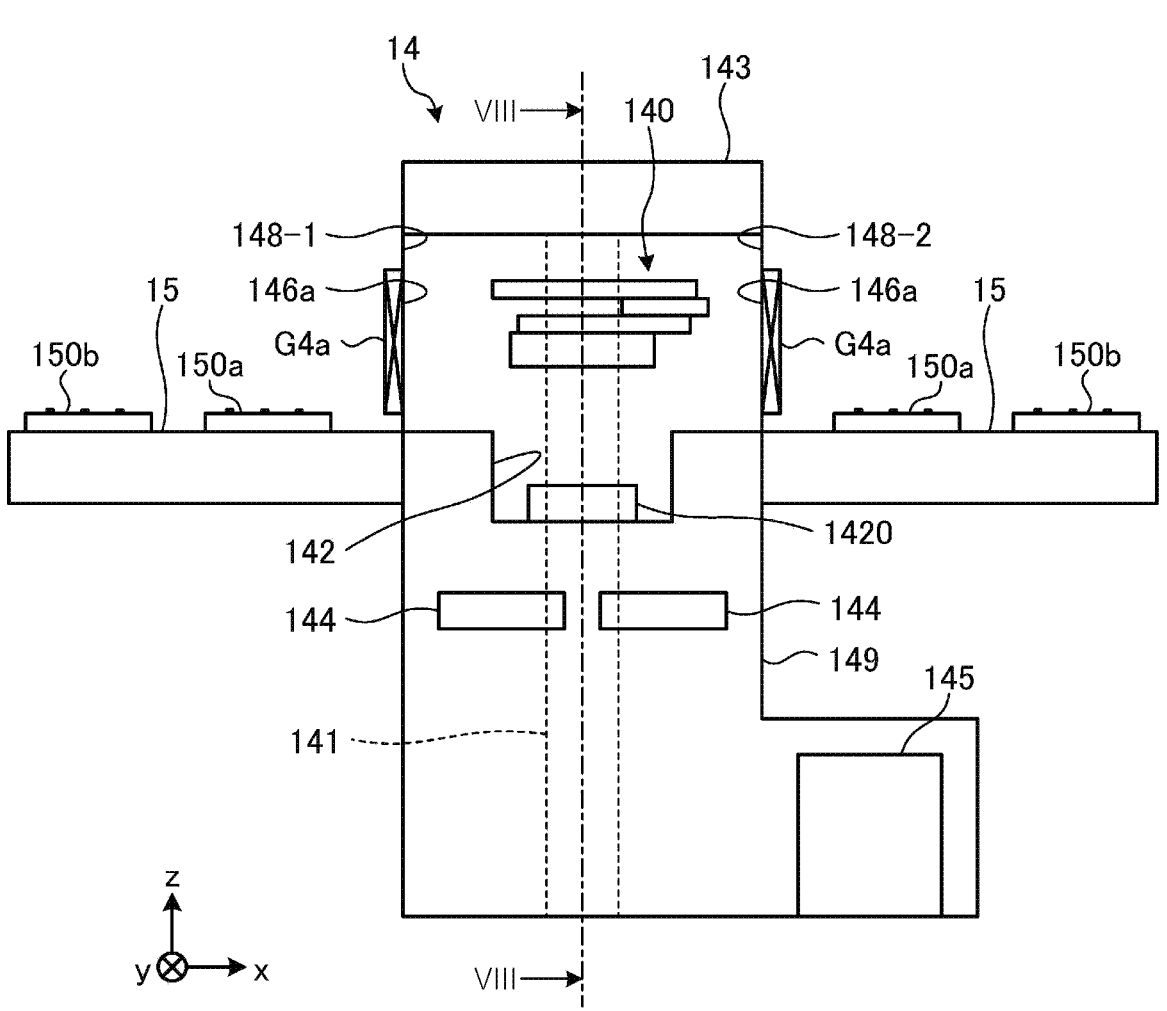
FIG. 7 is a schematic cross-sectional view showing an example of an VII-VII cross section of the equipment front end module EFEM and the load port LP illustrated in FIG. 6.
Figure 8:
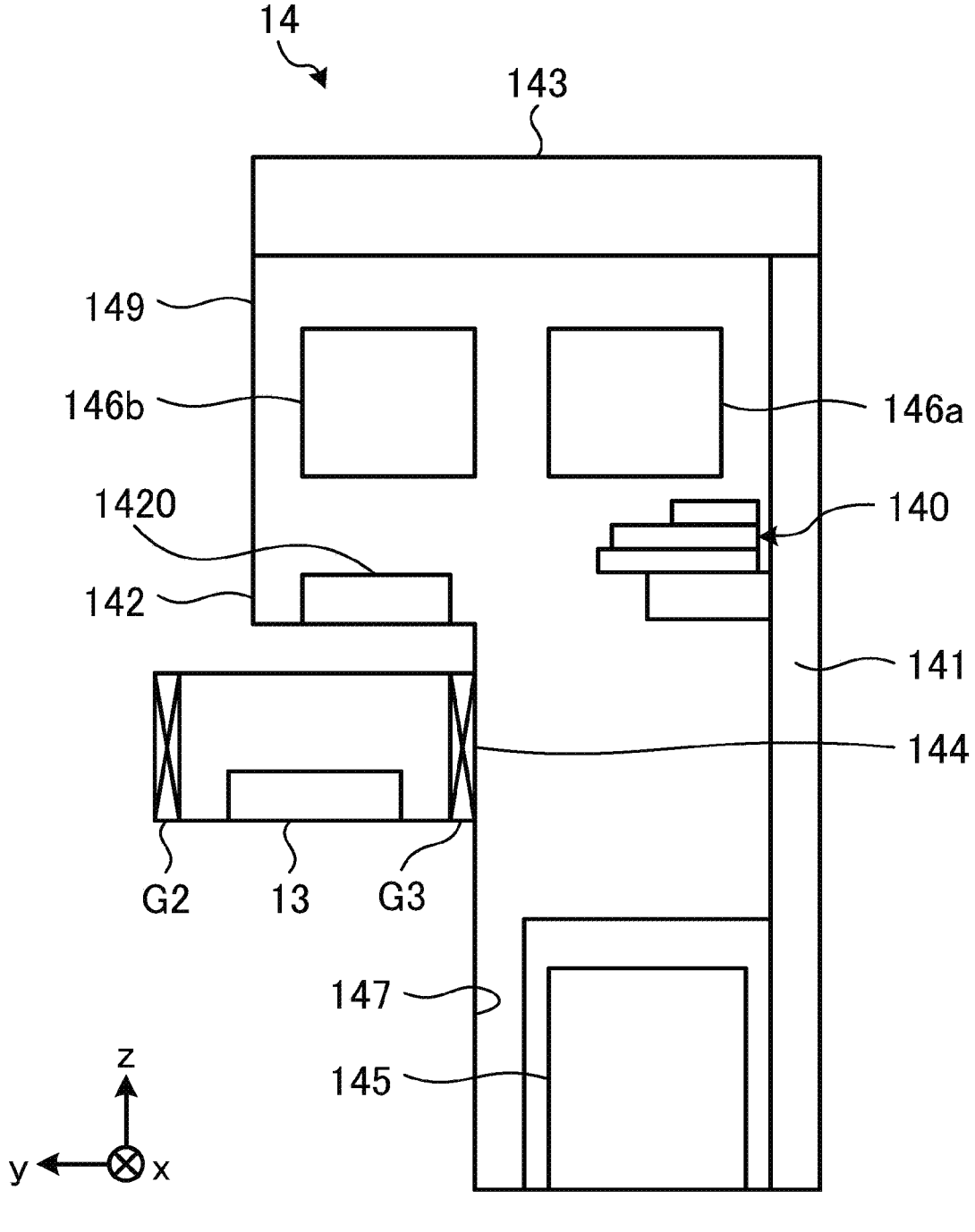
FIG. 8 is a schematic cross-sectional view showing an example of a VIII-VIII cross section of the equipment front end module EFEM illustrated in FIG. 7.

FIG. 6 is a schematic plan view showing an example of the equipment front end module EFEM 14 and the load port LP in the second embodiment. FIG. 7 is a schematic cross-sectional view showing an example of an VII-VII cross section of the equipment front end module EFEM 14 and the load port LP 15 illustrated in FIG. 6. FIG. 8 is a schematic cross-sectional view showing an example of a VIII-VIII section of the equipment front end module EFEM 14 illustrated in FIG. 7. As shown in FIGS. 6 and 7, for example, the load port LP 15 in the present embodiment is provided with multiple moving parts 150a and multiple moving parts 150b. The moving parts 150a and 150b are arranged side by side along the sidewall surface facing the sidewall 147 of the equipment front end module EFEM 14 (for example, along the X-axis direction in FIG. 6). In the present embodiment, a gap ΔL1 between the moving part 150a and the moving part 150b is, for example, 505 mm based on a Semiconductor Equipment and Materials International (SEMI) standard.

Multiple openings 146a and multiple openings 146b to which the containers 16 placed on the load ports LP 15 are connected are formed in each of the sidewalls 148-1 and 148-2 of the equipment front end module EFEM 14. In the present embodiment, the openings 146a and 146b, for example, are arranged side by side along the surfaces of the sidewalls 148-1 and 148-2 of the equipment front end module EFEM 14 (for example, along the Y-axis direction in FIGS. 6 and 8) as shown in FIGS. 6 and 8. In the example of FIGS. 6 and 8, the openings 146a and 146b are arranged in the horizontal direction along the surfaces of the sidewalls 148-1 and 148-2 of the equipment front end module EFEM 14. The openings 146a are opened and closed by gate valves G4a, and the openings 146b are opened and closed by gate valves G4b.

Further, in the equipment front end module EFEM 14 of the present embodiment, the openings 144 to which the load-lock modules LLM 13 are connected and the openings 146b to which the containers 16 are connected are located at different heights as shown in FIGS. 7 and 8, for example. Further, as shown in FIG. 8, for example, the surface of the sidewall 147 protrudes toward the regions of the sidewalls 148-1 and 148-2 when viewed in a direction intersecting the sidewalls 148-1 and 148-2. In other words, as shown in FIG. 8, for example, in the equipment front end module EFEM 14, the width of the sidewalls 148-1 and 148-2 at the height where the openings 146a and 146b are formed is greater than the width of the sidewalls 148-1 and 148-2 at the height where the openings 144 are formed. Further, the openings 146a may be formed at the same height as the openings 146b or the openings 144, or may be formed at a height different from those of the openings 146b and the openings 144.

In the example of FIGS. 6 to 8, two openings 146a and 146b are formed in each of the sidewalls 148-1 and 148-2 of the equipment front end module EFEM 14, and the load port 15 is provided with two moving parts 150a and 150b. However, the present disclosure is not limited thereto. In another example, three or more openings 146 may be formed in each of the sidewalls 148-1 and 148-2 of the equipment front end module EFEM 14, and the load port LP 15 may be provided with three or more moving parts 150.

[Operation of Load Port LP 15]

Figure 9A:
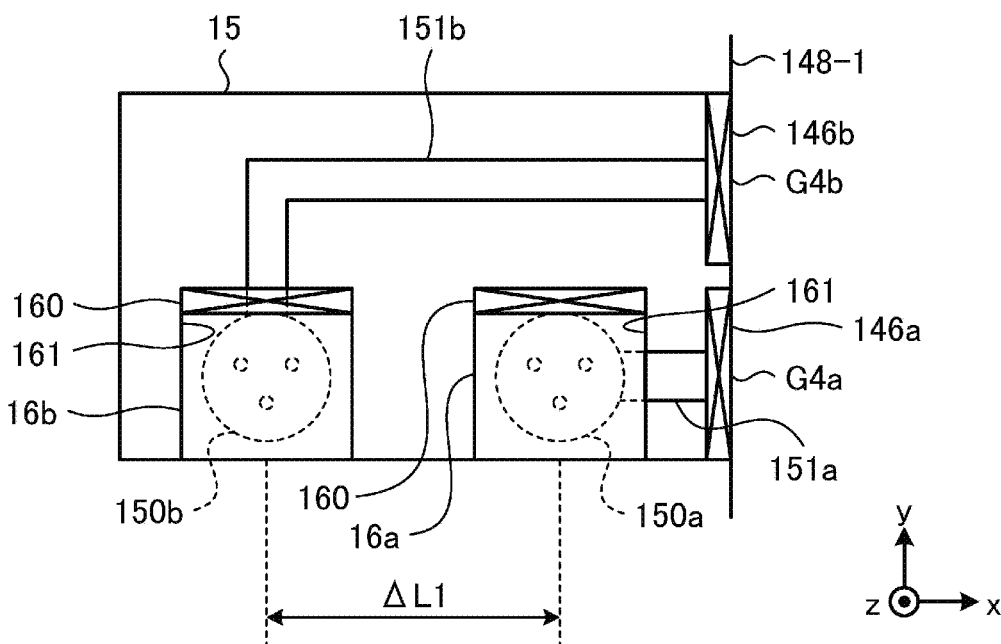
FIGS. 9A to 9D show an example of a process in which a container placed on a moving part of the load port LP is connected to the equipment front end module EFEM.
Figure 9B:
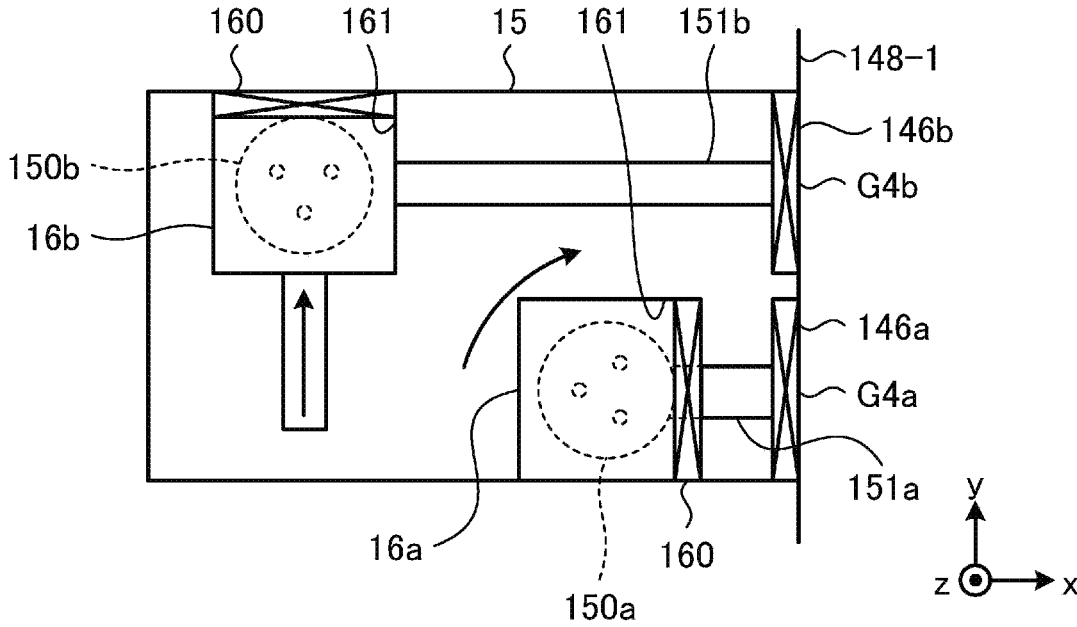
Figure 9C:
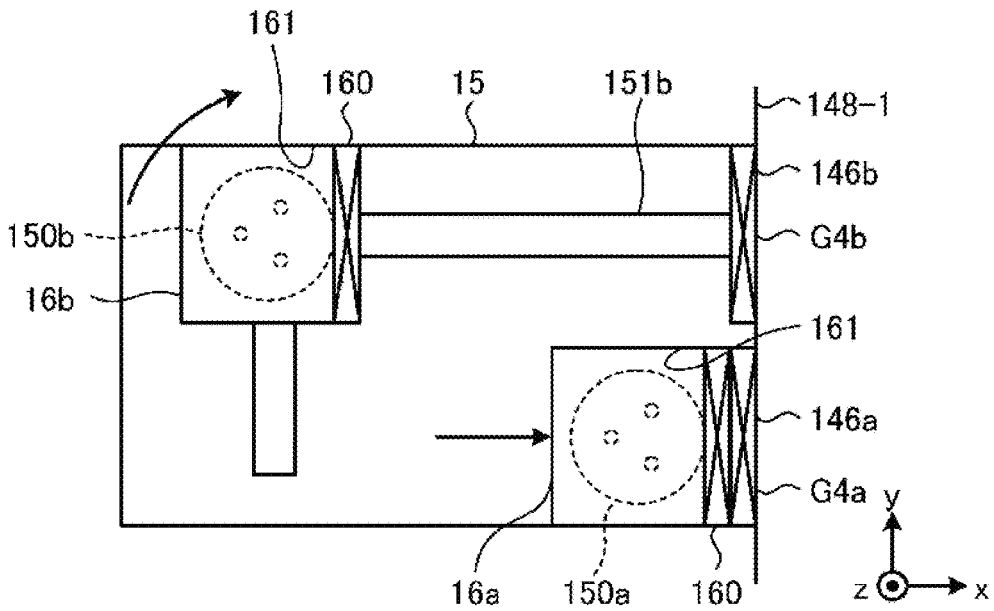

FIGS. 9A to 9D show an example of a process in which the containers 16 placed on the moving parts 150*a* and 150*b* of the load port LP 15 are connected to the equipment front end module EFEM. In FIGS. 9A to 9C, the load port LP 15 connected to the sidewall 148-1 is illustrated.

Containers 16*a* and 16*b* such as a FOUP accommodating a plurality of substrates W and the like are transferred by a transfer mechanism such as an OHT or the like, and are placed on the moving parts 150*a* and 150*b*, respectively. At this time, the containers 16*a* and 16*b* are placed on the moving parts 150*a* and 150*b*, respectively, such that the surface of the opening 161 is provided along the sidewall surface facing the sidewall 147 of the equipment front end module EFEM 14 (along the X-axis direction in the example of FIG. 9A).

Next, as shown in FIG. 9B, for example, the moving part 150*a* changes the direction of the container 16*a* such that the surface of the opening 161 is provided along the sidewall 148-1 of the equipment front end module EFEM 14 (along the Y-axis direction in the example of FIG. 9B). Further, as shown in FIG. 9B, for example, the moving part 150*b* moves the container 16*b* along the sidewall 148-1 of the equipment front end module EFEM 14 (for example, in the Y-axis direction in FIG. 9B).

Next, as shown in FIG. 9C, for example, the moving part 150*a* moves on the guide rail 151*a* to move the container 16*a* so that the opening 161 of the container 16*a* and the opening 146*a* of the equipment front end module EFEM 14 become close. Further, as shown in FIG. 9C, for example, the moving part 150*b* changes the direction of the container 16*b* such that the surface of the opening 161 is provided along the sidewall 148-1 of the equipment front end module EFEM 14 (along the Y-axis direction in the example of FIG. 9C).

Figure 9D:
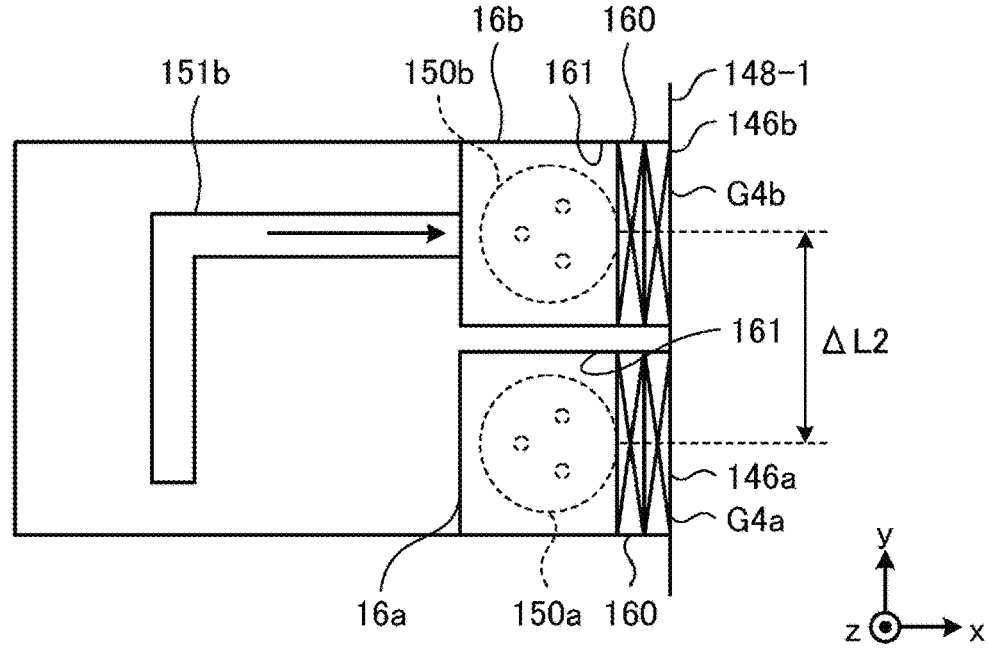

Next, as shown in FIG. 9D, for example, the moving part 150*b* moves on the guide rail 151*b* to move the container 16*b* so that the opening 161 of the container 16*b* and the opening 146*b* of the equipment front end module EFEM 14 become close. Thereafter, the containers 16*a* and 16*b* are connected to the equipment front end module EFEM 14 by opening the doors 160 and the gate valves G4. Accordingly, the containers 16*a* and 16*b* are connected to the equipment front end module EFEM 14 while being arranged in the horizontal direction along the sidewall of the equipment front end module EFEM 14.

Here, a gap ΔL2 between the containers 16*a* and 16*b* connected to the equipment front end module EFEM 14 is smaller than the gap ΔL1 illustrated in FIGS. 6 and 9A. In the present embodiment, the gap ΔL2 is, for example, 400 mm. Accordingly, the length of the equipment front end module EFEM 14 in the Y-axis direction can be shortened, which makes it possible to reduce the installation area of the substrate processing system 1.

The second embodiment has been described above. As described above, in the present embodiment, the openings 146*a* and 146*b* are formed in each of the sidewalls 148-1 and 148-2 of the equipment front end module EFEM 14 to be arranged in the horizontal direction along the surface of the sidewall 148-1 or 148-2 of the equipment front end module EFEM 14. Accordingly, a larger number of containers 16 can be connected to the equipment front end module EFEM 14.

In the above-described embodiment, the openings 144 communicating with the load-lock modules LLM 13 are formed in the sidewall 147 of the equipment front end module EFEM 14, and the openings 144 and 146 are formed at different height positions. Accordingly, the transfer of the substrate W through the opening 144 and the transfer of the substrate W through the opening 146 can be performed without interference.

Further, in the above-described embodiment, the surface of the sidewall 147 where the openings 144 are formed protrudes toward the regions of the sidewalls 148-1 and 148-2 when viewed in a direction intersecting the sidewalls 148-1 and 148-2 of the equipment front end module 14. Accordingly, the equipment front end module EFEM 14 can be scaled down while ensuring the regions of the openings 146 for connection with the containers 16 at each of the sidewalls 148-1 and 148-2.

Third Embodiment

In the second embodiment, a plurality of containers 16 are connected to each of the sidewalls 148-1 and 148-2 of the equipment front end module EFEM 14 while being arranged in the horizontal direction. On the other hand, the present embodiment is different from the second embodiment in that the plurality of containers 16 are connected to each of the sidewalls 148-1 and 148-2 of the equipment front end module EFEM 14 while being arranged in the vertical direction. Hereinafter, the differences between the second embodiment and the present embodiment will be mainly described.

Figure 10:
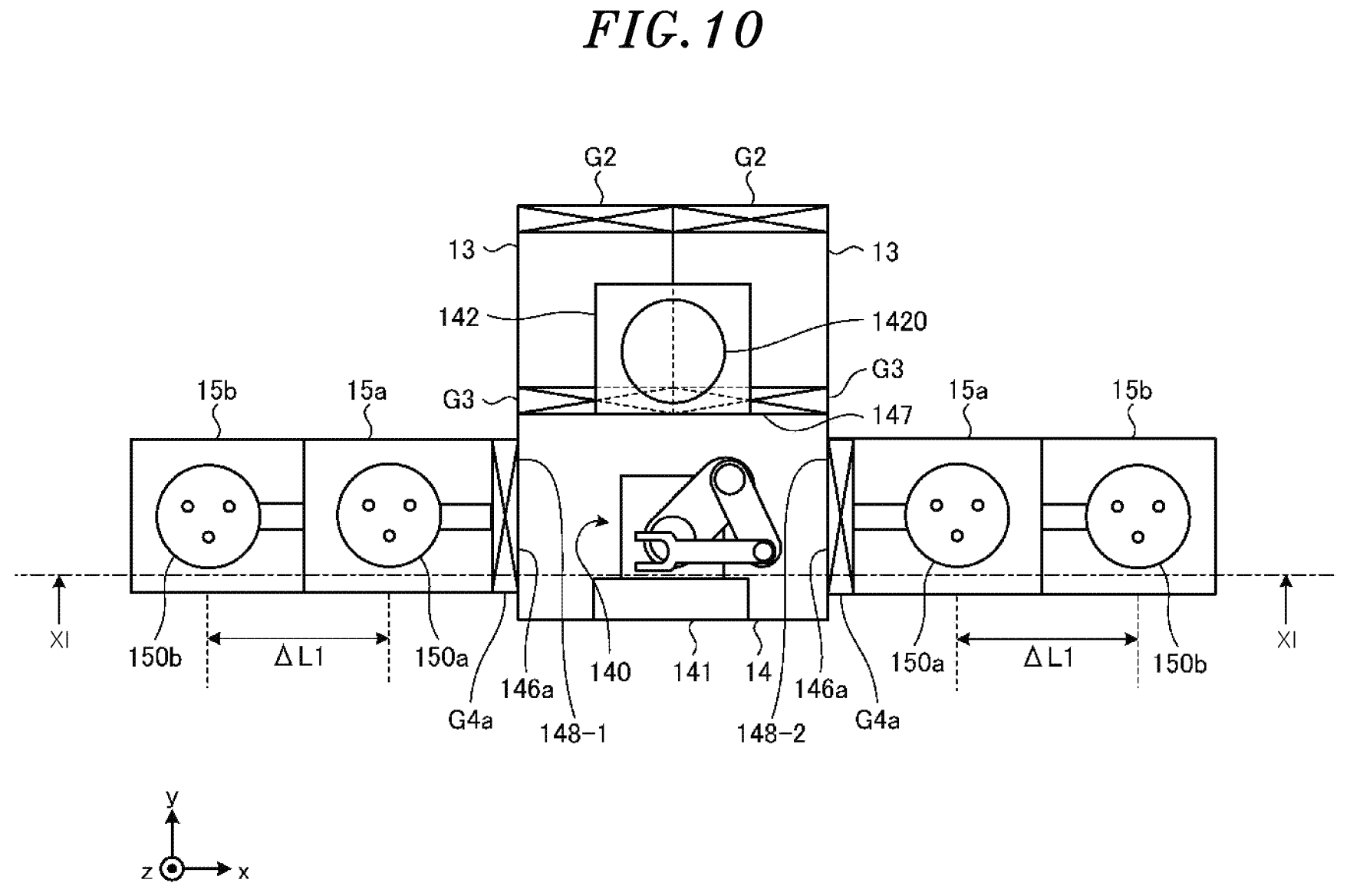
Figure 11:
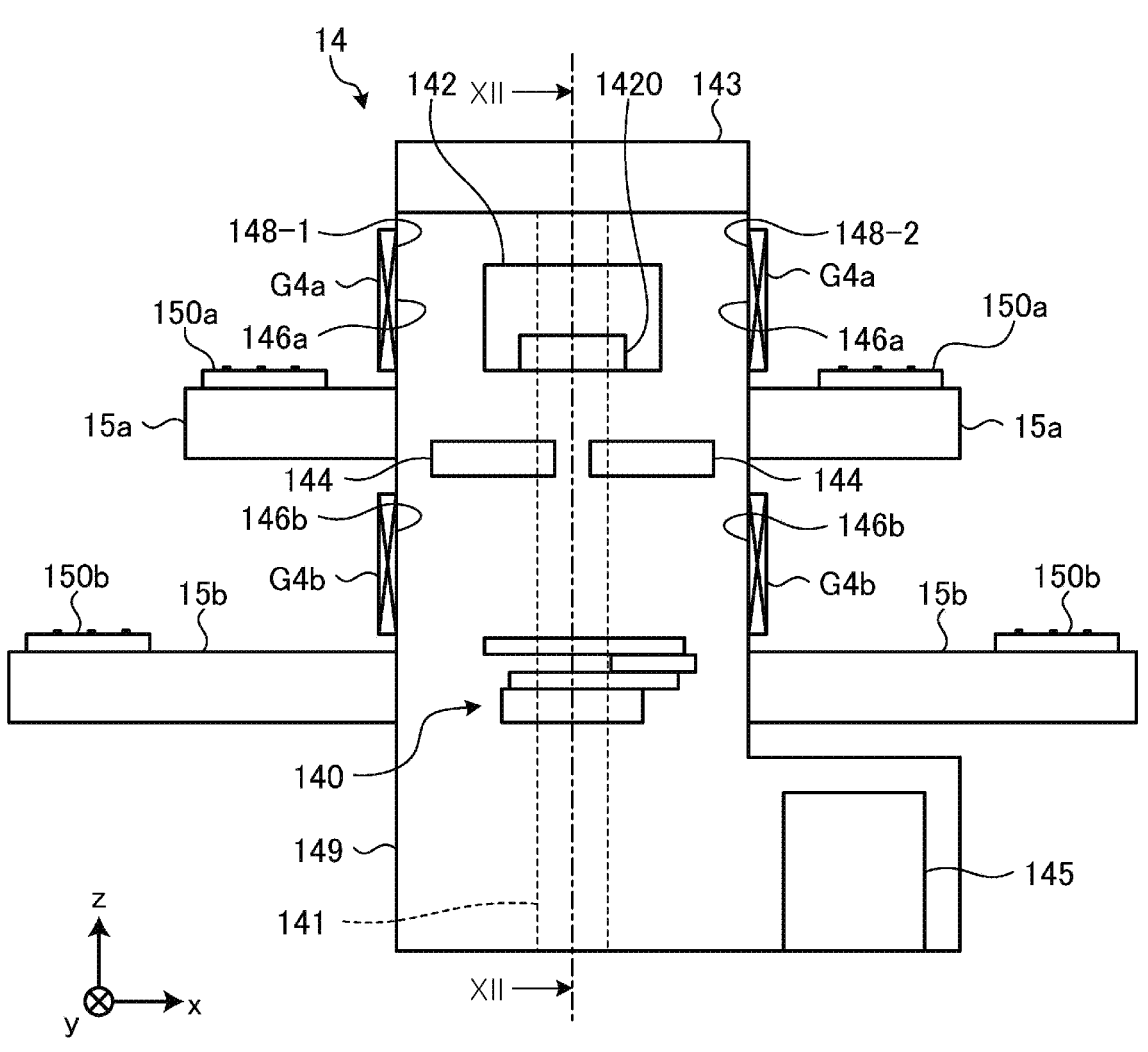
FIG. 11 is a schematic cross-sectional view showing an example of an XI-XI cross section of the equipment front end module EFEM and the load port LP illustrated in FIG. 10.
Figure 12:
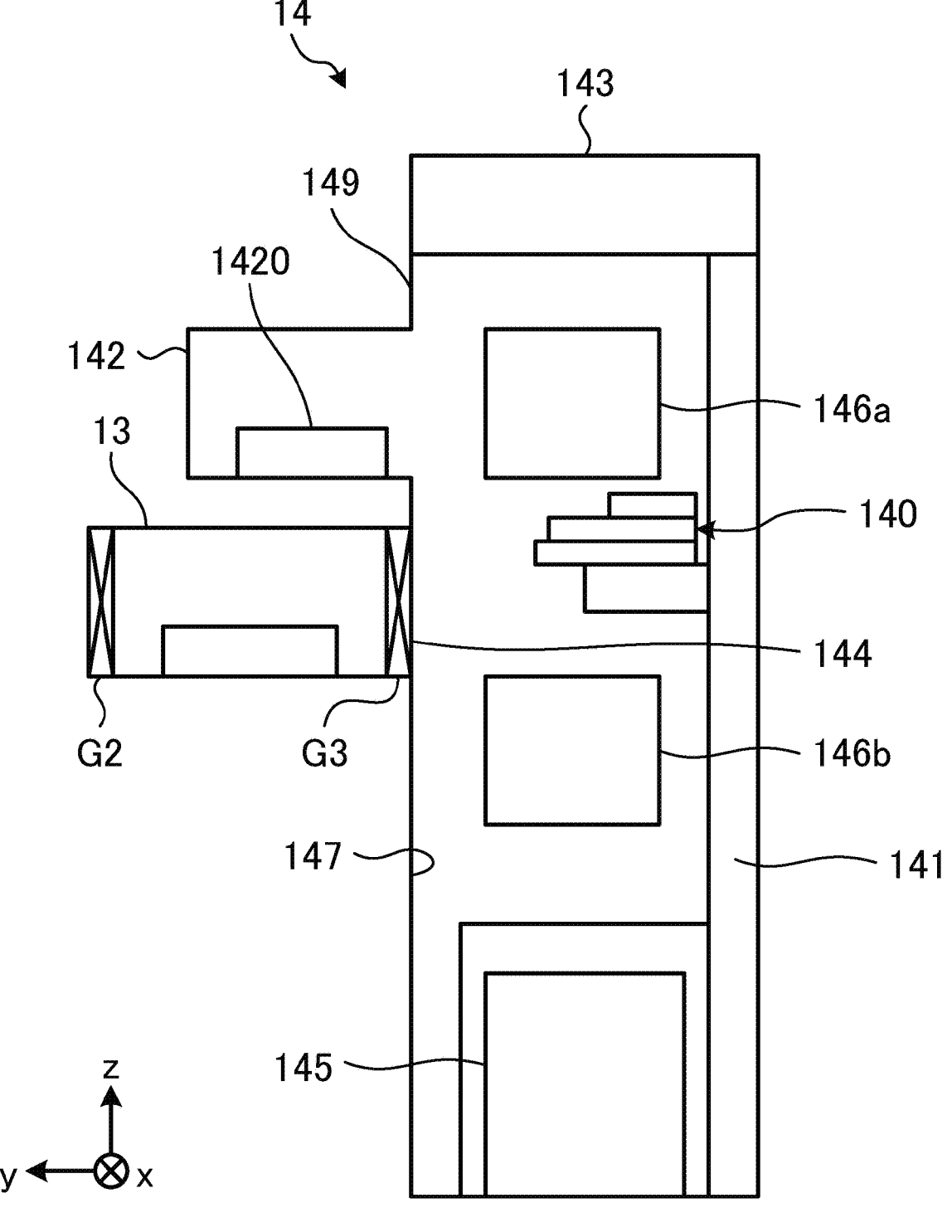
FIG. 12 is a schematic cross-sectional view showing an example of a XII-XII cross section of the equipment front end module EFEM illustrated in FIG. 11.

FIG. 10 is a schematic plan view showing an example of the equipment front end module EFEM 14 and the load port LP in the third embodiment. FIG. 11 is a schematic cross-sectional view showing an example of an XI-XI cross section of the equipment front end module EFEM 14 and the load port LP 15 illustrated in FIG. 11. FIG. 12 is a schematic cross-sectional view showing an example of a XII-XII cross section of the equipment front end module EFEM 14 illustrated in FIG. 11. In the present embodiment, as shown in FIGS. 10 and 11, for example, multiple load ports LP 15*a* and multiple load ports 15*b* are arranged in the vertical direction (longitudinal direction) along the surfaces of the sidewalls 148-1 and 148-2 of the equipment front end module EFEM 14. The load port LP 15*a* is provided with the moving part 150*a*, and the load port 15*b* is provided with the moving part 150*b*. In the example of FIG. 11, the load port LP 15*a* is disposed above the load port LP 15*b* and extends outward from the sidewall 148-1 or 148-2 along the X-axis direction. Further, the moving parts 150*a* and 150*b* are arranged at different positions in plan view. The load port LP 15*b* disposed at the sidewall 148-1 is an example of a first load port, and the load port LP 15*a* disposed at the sidewall 148-1 is an example of a third load port. The load port LP 15*b* disposed at the sidewall 148-2 is an example of a second load port, and the load port LP 15*a* disposed at the sidewall 148-2 is an example of a fourth load port. Further, the moving part 150*b* disposed at the load port LP 15*b* on the sidewall 148-1 is an example of a first substrate carrier stage, and the moving part 150*b* disposed at the load port LP 15*a* on the sidewall 148-1 is an example of a third substrate carrier stage. Further, the moving part 150*b* disposed at the load port LP 15*b* on the sidewall 148-2 is an example of a second substrate carrier stage, and the moving part 150*b* disposed at the load port LP 15*a* on the sidewall 148-2 is an example of a fourth substrate carrier stage. In the present embodiment, in the load ports LP 15*a* and 15*b* disposed at one sidewall 148-1 or 148-2, the gap ΔL1 between the moving part 150*a* and the moving part 150*b* in plan view is, for example, 505 mm based on the SEMI standard.

As shown in FIGS. 11 and 12, for example, the openings 146*a* and 146*b* are formed in each of the sidewalls 148-1 and 148-2 along the vertical direction. In the present embodiment, at least one of the openings 146a and 146b (the opening 146a in the example of FIGS. 11 and 12) is formed at a position higher than the openings 144 to which the load-lock modules LLM 13 are connected. At least another one of the openings 146a and 146b (the opening 146b in the example of FIGS. 11 and 12) is formed at a position lower than the openings 144 to which the load-lock modules LLM 13 are connected.

Accordingly, the moving distance of the substrate W at the time of unloading the substrate W from the load-lock module LLM 13 to the container 16 can be reduced, which makes it possible to shorten the time required for transferring the substrate W. Further, the aligner unit 1420 is preferably located at a height position between the opening 146a and the opening 146b. Hence, the moving distance of the substrate W at the time of transferring the substrate W from the container 16 to the aligner unit 1420 can be reduced.

Further, in the present embodiment, as shown in FIGS. 11 and 12, for example, the openings 146a and 146b formed in each of the sidewalls 148-1 and 148-2 are formed on the same surface of the sidewall 148-1 or 148-2. Therefore, the unevenness of the sidewalls 148-1 and 148-2 can be reduced, and an inert gas can efficiently circulate in the housing 149 of the equipment front end module EFEM 14. Accordingly, it is possible to suppress the occurrence of gas accumulation in the housing 149. In another example, the openings 146a and 146b may be formed at different positions of each of the sidewalls 148-1 and 148-2 in plan view.

The openings 146a are formed in the sidewalls 148-1 and 148-2 where the load ports LP 15a are provided. The openings 146a are opened and closed by the gate valves G4a. The openings 146b are formed in the sidewalls 148-1 and 148-2 where the load ports LP 15b are provided. The openings 146b are opened and closed by the gate valves G4b. since the operations of the moving parts 150a and 150b are the same as that the moving part 150 in the first embodiment described with reference to FIGS. 5A to 5C, the description thereof will be omitted.

In the example of FIGS. 10 to 12, two openings 146a and 146b and two load ports LP 15a and 15b are disposed at each of the sidewalls 148-1 and 148-2 of the equipment front end module EFEM 14, but the present disclosure is not limited thereto. In another example, three or more openings 146 and three or more load ports LP 15 may be disposed at each of the sidewalls 148-1 and 148-2 of the equipment front end module EFEM 14.

The third embodiment has been described above. As described above, in the present embodiment, the openings 146a and 146b may be formed in each of the sidewalls 148-1 and 148-2 of the equipment front end module EFEM 14 to be arranged in the vertical direction. Accordingly, a larger number of containers 16 can be connected to the equipment front end module EFEM 14.

In the above-described embodiment, the openings 144 communicating with the load-lock modules LLM 13 are formed in the sidewall 147 of the equipment front end module EFEM 14, and the openings 146 communicating with the openings 161 formed in the containers 16 placed on the load ports LP 15 are formed in each of the sidewalls 148-1 and 148-2 of the equipment front end module EFEM 14. At least one of the openings 146 is formed at a position higher than the opening 144, and at least another one of the openings 146 is formed at a position lower than the opening 144. Accordingly, the time required for transferring the substrate W can be shortened.

Fourth Embodiment

In a second embodiment, a plurality containers 16 are connected to each of the sidewalls 148-1 and 148-2 of the equipment front end module EFEM 14 while being arranged in the horizontal direction. In the third embodiment, the containers 16 are connected to each of the sidewalls 148-1 and 148-2 of the equipment front end module EFEM 14 while being arranged in the vertical direction. On the other hand, the present embodiment is different from the second embodiment and the third embodiment in that the plurality of containers 16 are connected to each of the sidewalls 148-1 and 148-2 of the equipment front end module EFEM 14 while being arranged in the horizontal direction and the vertical direction. Hereinafter, the differences between the present embodiment and the second and third embodiments will be mainly described.

Figure 13:
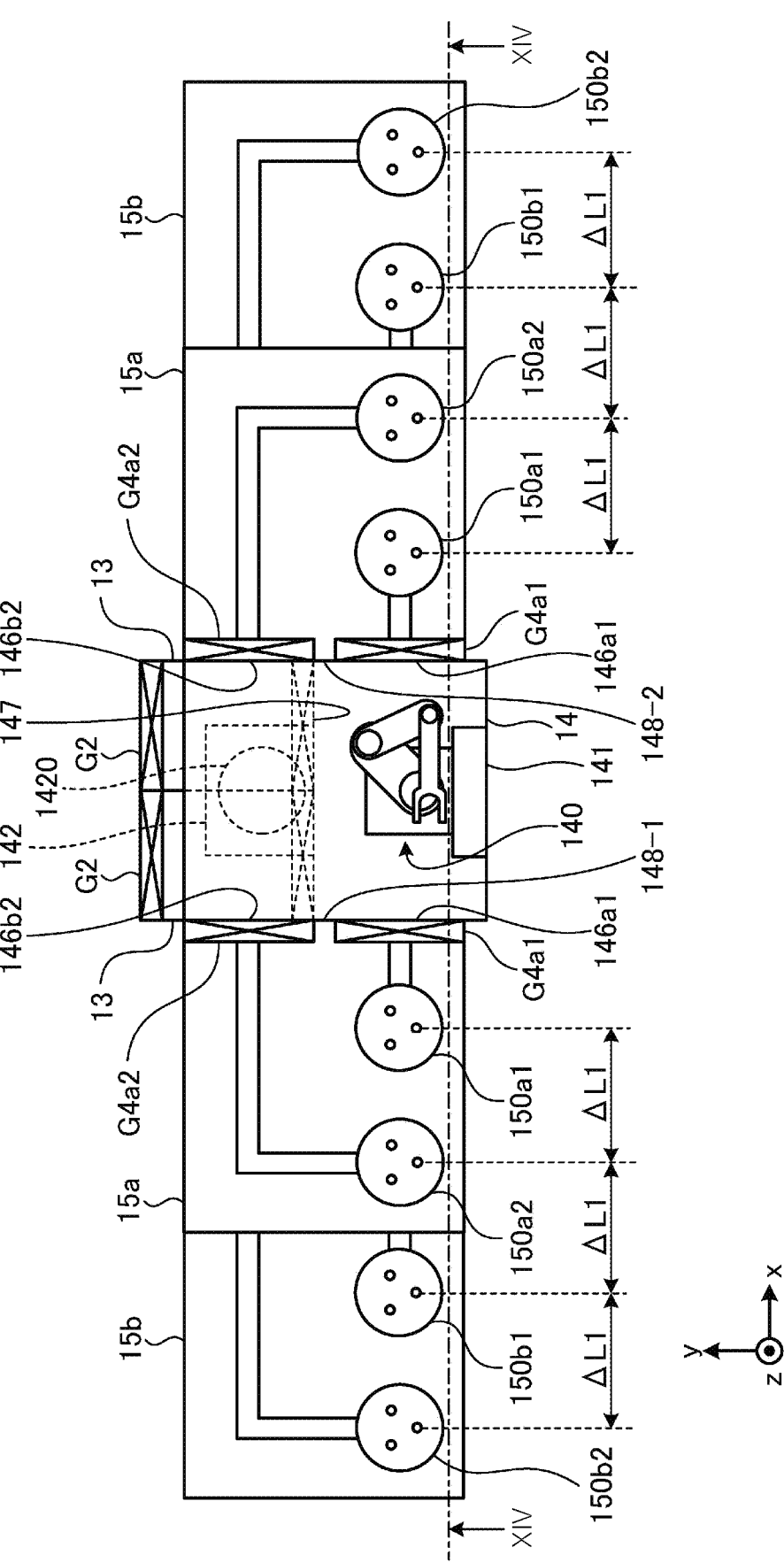
FIG. 13 is a schematic plan view showing an example of an equipment front end module EFEM and a load port LP in a fourth embodiment.
Figure 14:
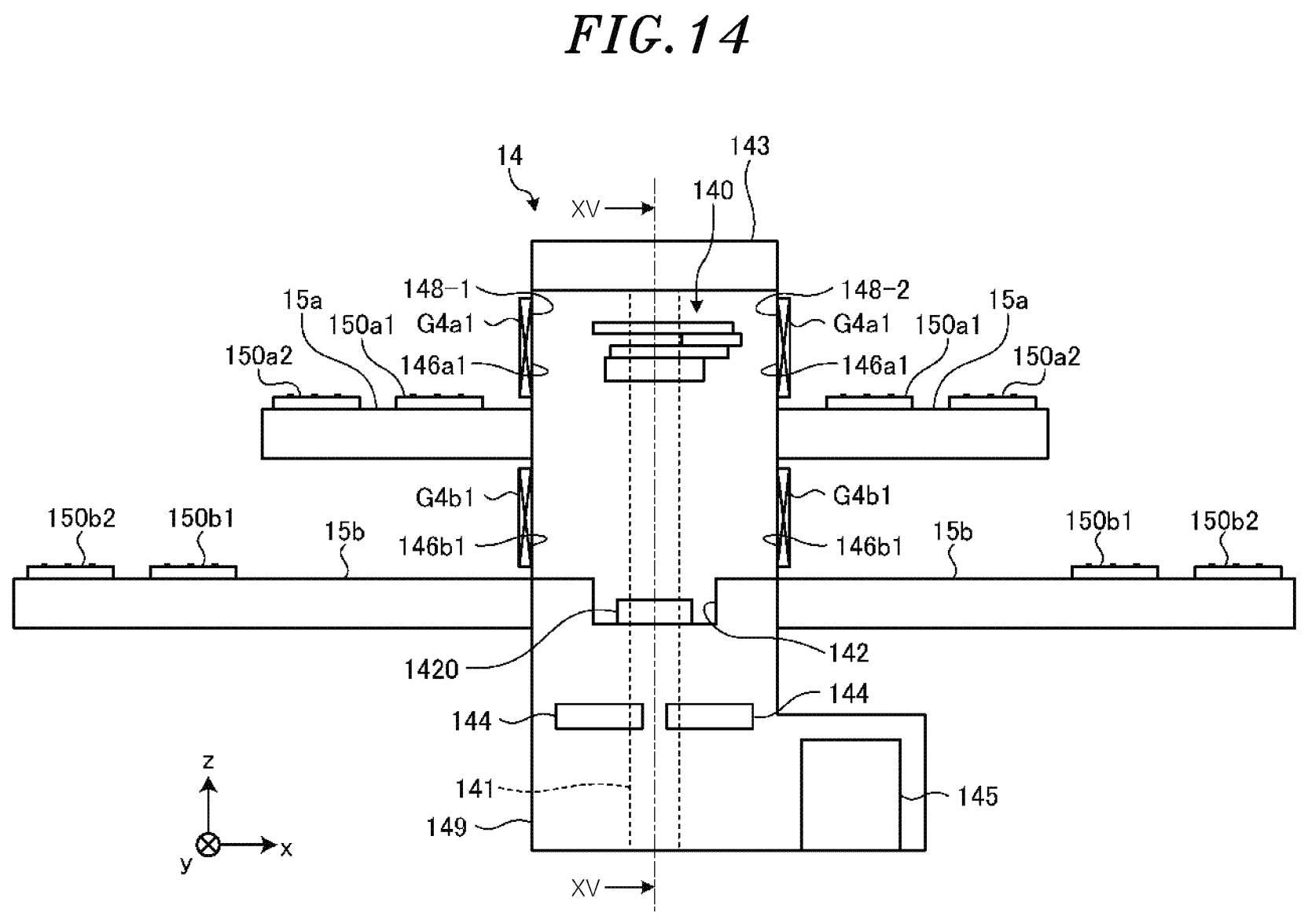
Figure 15:
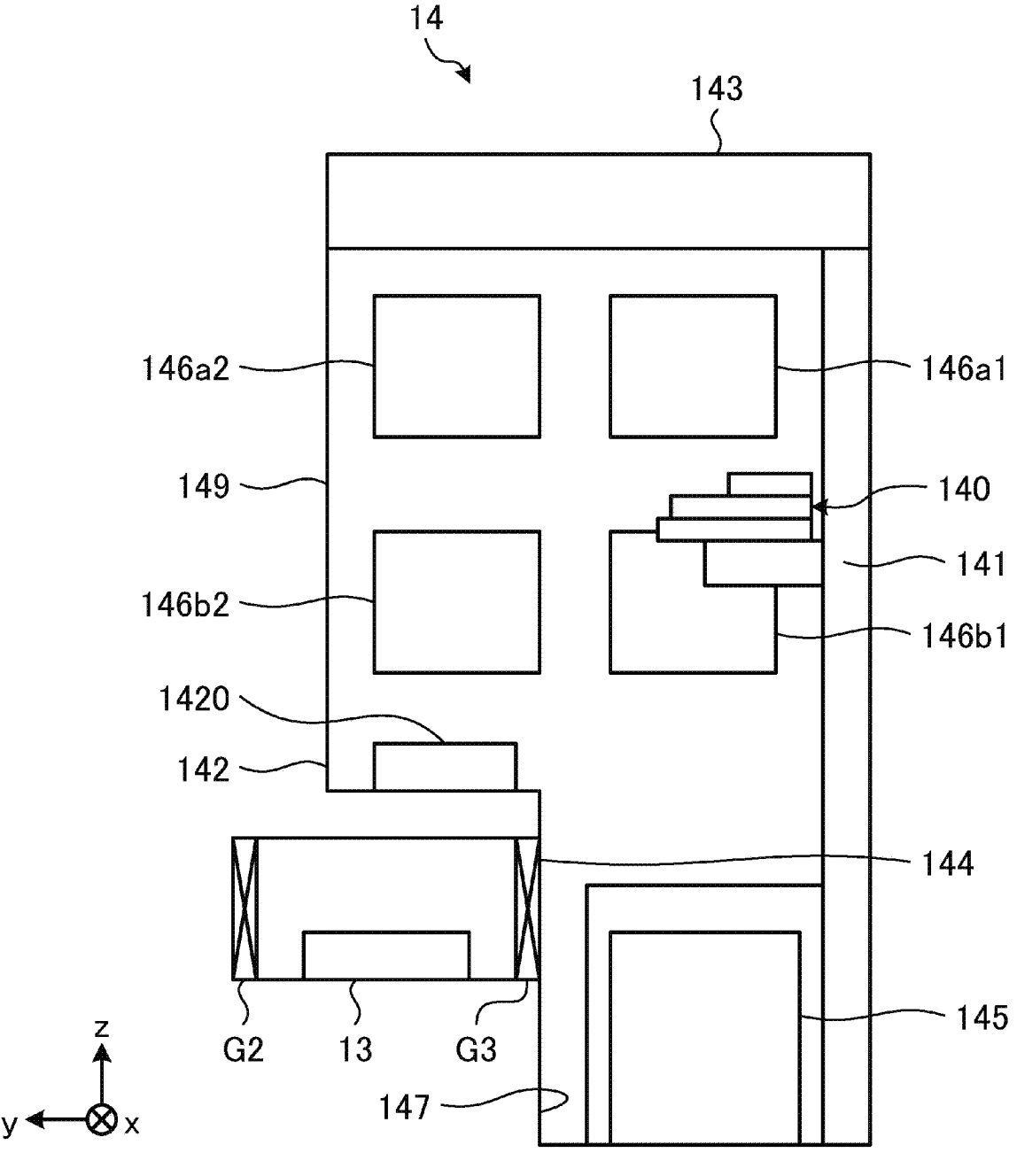
FIG. 15 is a schematic cross-sectional view showing an example of a XV-XV cross section of the equipment front end module EFEM illustrated in FIG. 14.

FIG. 13 is a schematic plan view showing an example of the equipment front end module EFEM 14 and the load port LP in the fourth embodiment. FIG. 14 is a schematic cross-sectional view showing an example of an XIV-XIV cross section of the equipment front end module EFEM 14 and the load port LP 15 illustrated in FIG. 13. FIG. 15 is a schematic cross-sectional view showing an example of a XV-XV cross-section of the equipment front end module EFEM 14 illustrated in FIG. 14. As shown in in FIGS. 13 to 15, for example, openings 146a1 and 146a2 are formed in each of the sidewalls 148-1 and 148-2 of the equipment front end module EFEM 14 while being arranged in the horizontal direction (for example, along the Y-axis direction in FIGS. 13 to 15) along the surface of each of the sidewalls 148-1 and 148-2. As shown in FIGS. 13 to 15, for example, openings 146b1 and 146b2 are formed in each of the sidewalls 148-1 and 148-2 of the equipment front end module EFEM 14 while being arranged in the horizontal direction (for example, along the Y-axis direction in FIGS. 13 to 15) along the surface of each of the sidewalls 148-1 and 148-2. Further, as shown in FIGS. 13 to 15, for example, the openings 146a1 and 146b1 and the openings 146a2 and 146b2 are formed in each of the sidewalls 148-1 and 148-2 while being arranged in the vertical direction (for example, along the Z-axis direction in FIGS. 13 to 15) along the surface of each of the sidewalls 148-1 and 148-2.

Further, in the present embodiment, as shown in FIGS. 13 to 15, for example, the load ports LPs 15a and 15b are arranged in the vertical direction along each of the sidewalls 148-1 and 148-2 of the equipment front end module EFEM 14. The load port LP 15a is provided with moving parts 150a1 and 150a2. The load port 15b is provided with moving parts 150b1 and 150b2. In the load ports 15a and 15b disposed at each of the sidewalls 148-1 and 148-2, the gap ΔL1 between the moving parts 150a1 and 150a2 and the moving parts 150b1 and 150b2 in plan view is, for example, 505 mm based on the SEMI standard.

The openings 146a1 are opened and closed by gate valves G4a1, and the openings 146a2 are opened and closed by gate valves G4a2. The openings 146b1 are opened and closed by gate valves G4b1, and the openings 146b2 are opened and closed by gate valves G4b2.

Further, in the equipment front end module EFEM 14 of the present embodiment, the openings 144 to which the load-lock modules LLM 13 are connected, and the openings 146a2 and 146b2 to which the containers 16 are connected are formed at different height positions, as shown in FIG. 15, for example. Further, as shown in FIG. 15, for example, the surface of the sidewall 147 to which the load-lock chambers LLM 13 are connected protrudes toward the regions of the sidewalls 148-1 and 148-2 when viewed in a direction intersecting the sidewalls 148-1 and 148-2. In other words, as shown in FIG. 15, for example, in the equipment front end module EFEM 14, the width of the sidewalls 148-1 and 148-2 at the height where the openings 146a1 to 146b2 are formed is greater than the width of the sidewalls 148-1 and 148-2 at the height where the openings 144 are formed.

Since the operations of the moving parts 150a1, 150a2, 150b1, and 150b2 are the same as those of the moving parts 150a and 150b in the second embodiment described with reference to FIGS. 9A to 9D, the description thereof will be omitted.

Further, in the example of FIGS. 13 to 15, one load port LP 15 is provided with two moving parts 150. However, one load port LP 15 may be provided with three or more moving parts 150. Further, in the example of FIGS. 13 to 15, two load ports LP 15 are disposed at each of the sidewalls 148-1 and 148-2. However, three or more load ports 15 may be disposed at each of the sidewalls 148-1 and 148-2.

The fourth embodiment has been described above. Also in the present embodiment, the installation area of the substrate processing system 1 can be reduced.

Fifth Embodiment

In the first to fourth embodiments, the sidewall 147 of the equipment front end module EFEM 14 to which the load-lock modules LLM 13 are connected and the sidewalls 148-1 and 148-2 of the equipment front end module EFEM 14 to which the containers 16 are connected are different sidewalls. On the other hand, the present embodiment is different from the first to fourth embodiments in that the sidewall 147 and the sidewall 148 are the same sidewall. Hereinafter, the differences between the present embodiment and the first to fourth embodiments will be mainly described.

Figure 16:
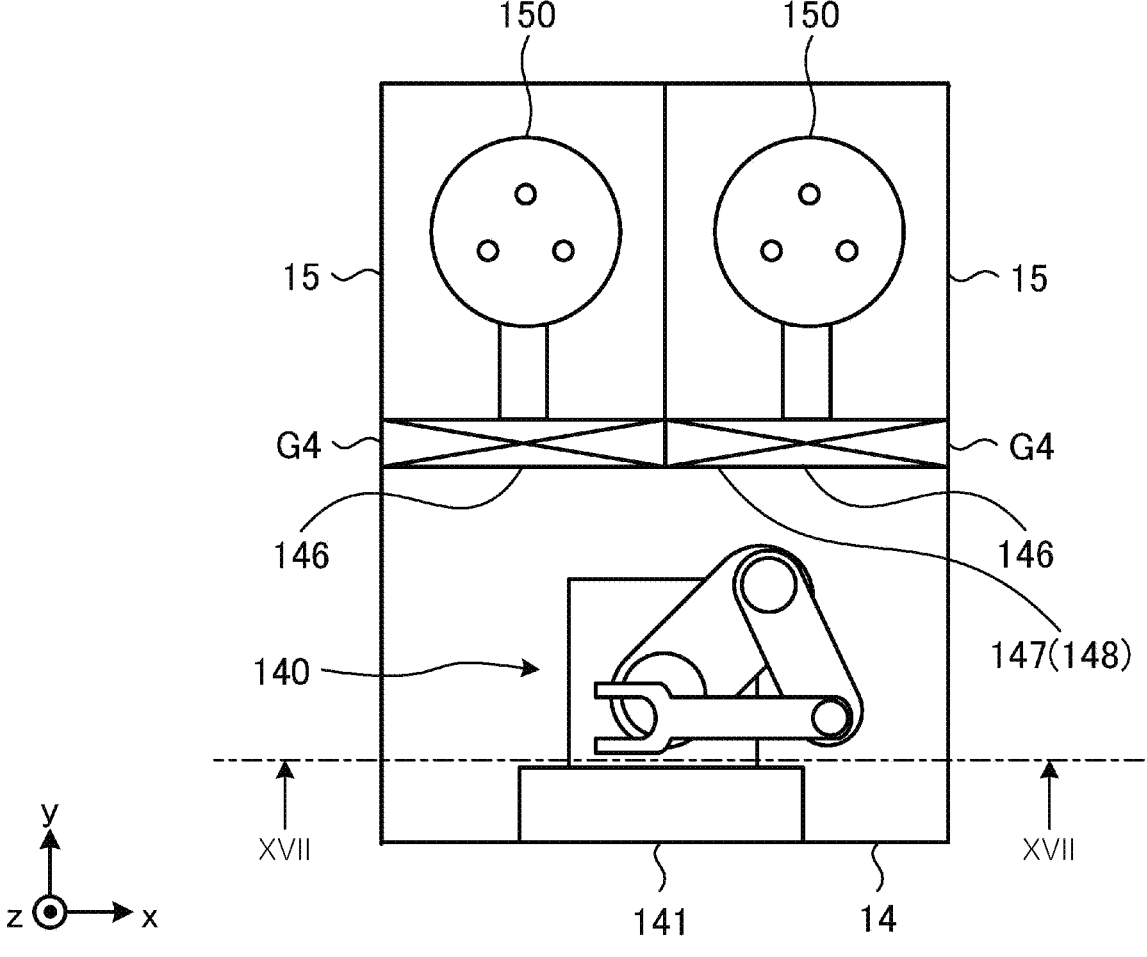
FIG. 16 is a schematic plan view showing an example of an equipment front end module EFEM and a load port LP in a fifth embodiment.
Figure 17:
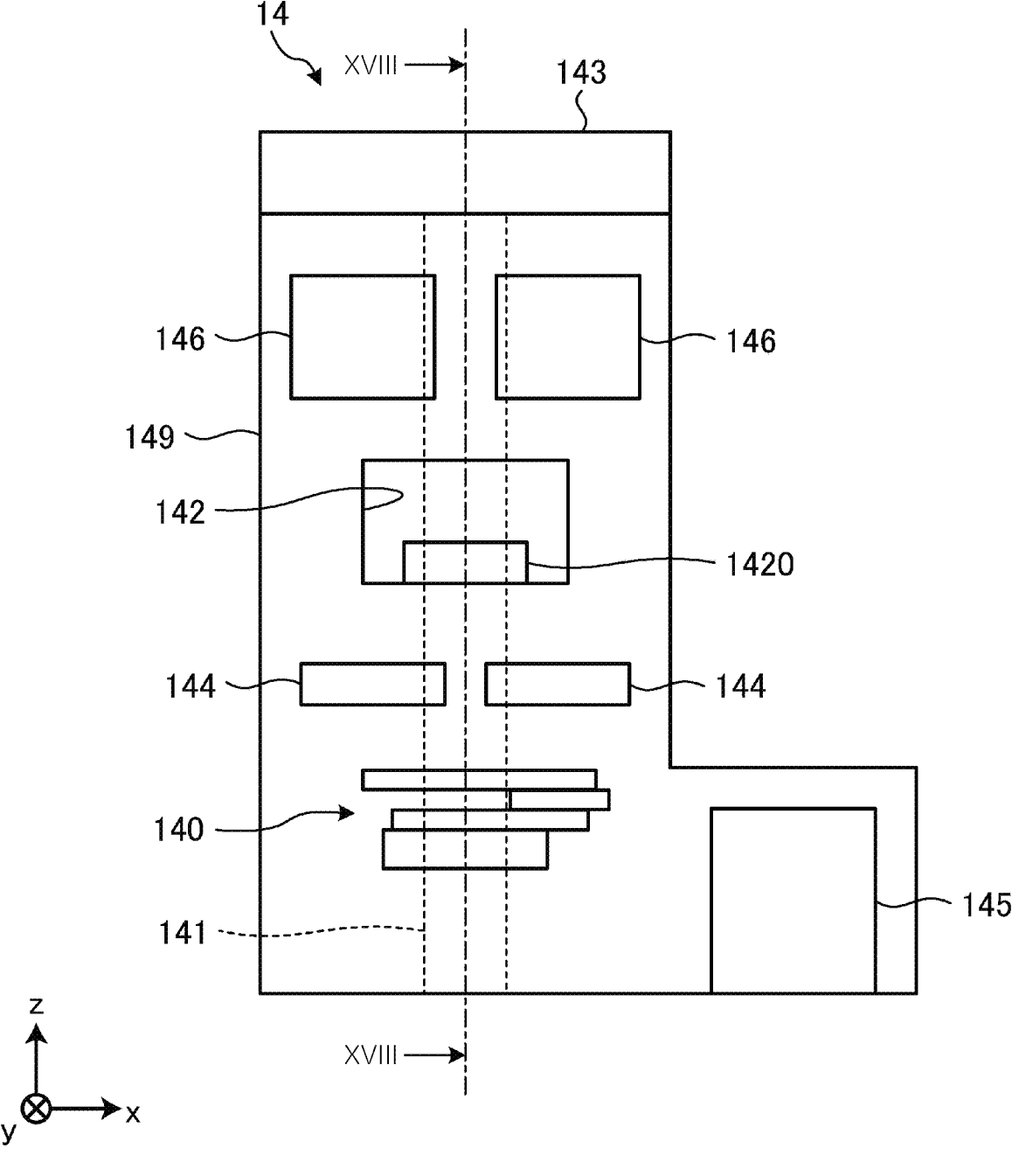
FIG. 17 is a schematic cross-sectional view showing an example of an XVII-XVII cross section of the equipment front end module EFEM illustrated in FIG. 16.
Figure 18:
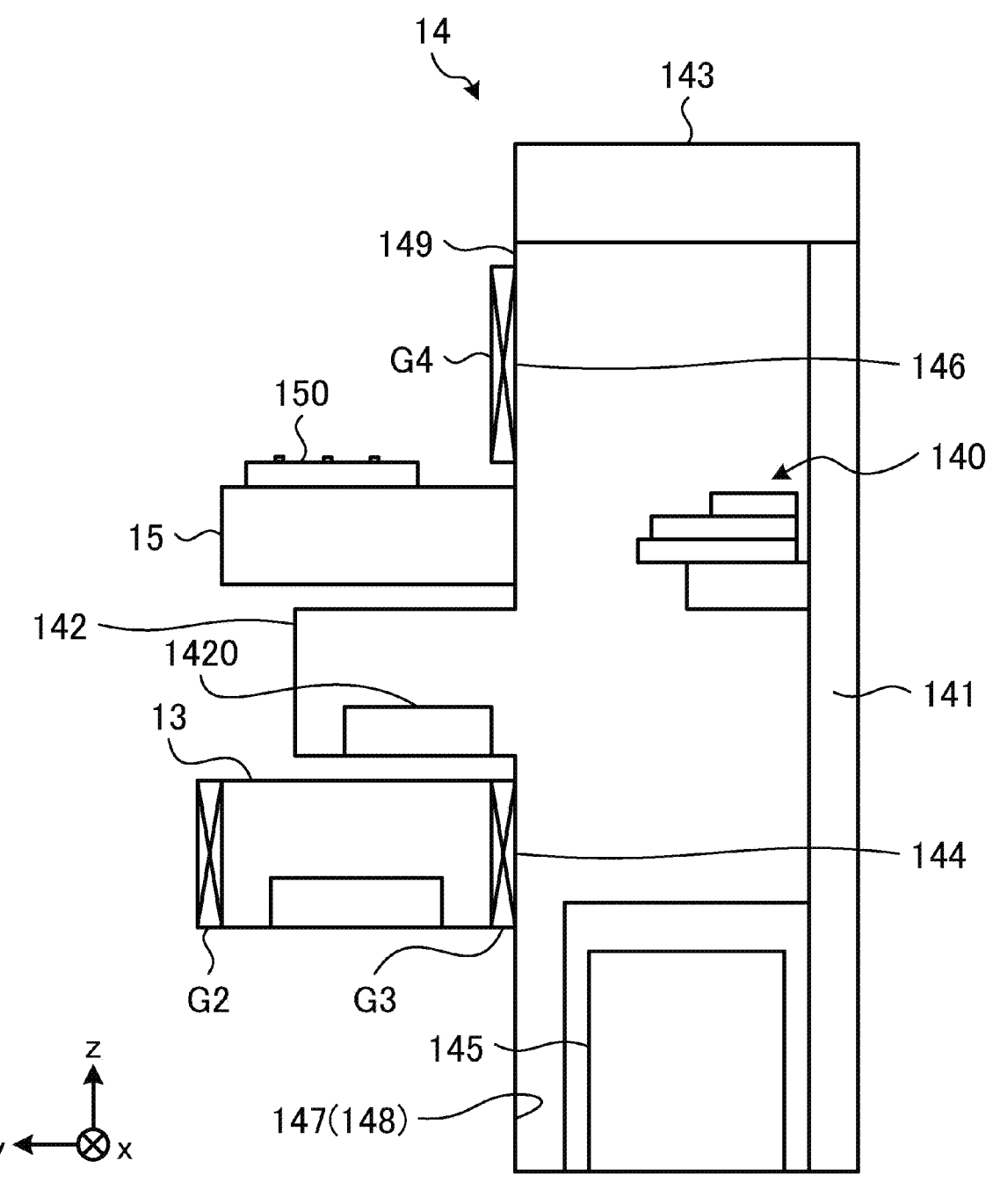
FIG. 18 is a schematic cross-sectional view showing an example of a XVIII-XVIII cross section of the equipment front end module EFEM illustrated in FIG. 17.

FIG. 16 is a schematic plan view showing an example of the equipment front end module EFEM 14 and the load port LP in the fifth embodiment. FIG. 17 is a schematic cross-sectional view showing an example of an XVII-XVII cross section of the equipment front end module EFEM 14 illustrated in FIG. 16. FIG. 18 is a schematic cross-sectional view showing an example of a XVIII-XVIII cross section of the equipment front end module EFEM 14 illustrated in FIG. 17. As shown in FIG. 18, for example, the openings 146 are formed in the sidewall 147 of the equipment front end module EFEM 14 to which the load-lock modules LLM 13 are connected. In the present embodiment, the sidewall 147 to which the load-lock modules LLM 13 are connected and the sidewall 148 to which the containers 16 are connected are the same sidewall. Further, on the sidewall 147, the openings 146 to which the containers 16 are connected are formed above the openings 144 communicating with the load-lock modules LLM 13. For example, the sidewall 148 to which the containers 16 are connected is disposed along the plane including the sidewall 147 to which the load-lock chambers 13 are connected. The sidewall 147 is an example of a first sidewall, and the sidewall 148 is an example of a second sidewall. With this configuration as well, the length of the substrate processing system 1 along the Y-axis direction in FIGS. 16 to 18 can be reduced. Accordingly, the installation area of the substrate processing system 1 can be reduced.

In the present embodiment, the alignment chamber 142 is disposed above the load-lock module LLM 13. Further, in the present embodiment, the alignment chamber 142 is disposed at a position lower than the openings 146 to which the containers 16 are connected and higher than the openings

144 to which the load-lock modules LLM 13 are connected. Accordingly, it is possible to shorten the moving distance of the substrate W at the time of loading the substrate W transferred from the container 16 into the alignment chamber 142 and having a direction adjusted by the aligner unit 1420 into the load-lock module LLM 13. Further, the alignment chamber 142 in which the aligner unit 1420 is disposed may be located at a position higher than the openings 146 or at a position lower than the openings 144.

Further, it should be noted that the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

For example, in each of the above-described embodiments, the vacuum transfer module VTM 11 and the equipment front end module EFEM 14 transfer the substrate W as an example of the object to be transferred. However, the present disclosure is not limited thereto. In another example, the present disclosure can be applied to the vacuum transfer module VTM 11 and the equipment front end module EFEM 14 that transfer an object to be transferred other than the substrate W, such as an edge ring, a cover ring, an upper electrode plate, an electrostatic chuck, or the like.

Further, in each of the above-described embodiments, the equipment front end module EFEM 14 has a rectangular shape in plan view. However, the present disclosure is not limited thereto. In another example, the equipment front end module EFEM 14 may have a triangle shape or a polygonal shape having five or more sides in plan view. When the equipment front end module EFEM 14 has a quadrilateral shape in plan view, the quadrilateral shape may include a trapezoidal shape, a parallelogram shape, a rhombic shape, or the like. Further, the equipment front end module EFEM 14 may have a planar shape in which at least one of multiple sides is curved.

In the above-described embodiments, the process module PM 12 for performing processing using capacitively coupled plasma (CCP) has been described as an example of the plasma source. However, the plasma source may be, for example, inductively coupled plasma (ICP), microwave excited surface wave plasma (SWP), electron cyclotron resonance plasma (ECP), helicon wave excited plasma (HWP), or the like, other than capacitively coupled plasma.

Further, the following additional statements are disclosed with respect to the above embodiments.

APPENDIX 1

A substrate transfer system comprising:

a load-lock module;

an atmospheric transfer module having a first sidewall, a second sidewall and a third sidewall, the first sidewall extending along a first direction and connected to the load-lock module, the second sidewall extending along a second direction perpendicular to the first direction, the third sidewall being disposed on an opposite side of the second sidewall;

a first load port extending outward from the second sidewall along the first direction; and a second load port extending outward from the third sidewall along the first direction.

APPENDIX 2

The substrate transfer system of appendix 1, wherein the first load port includes a first substrate carrier stage, and the second load port includes a second substrate carrier stage.

APPENDIX 3

The substrate transfer system of appendix 2, further comprising:
a third load port disposed above the first load port and extending outward from the second sidewall along the first direction,
wherein the third load port includes a third substrate carrier stage, and
the first substrate carrier stage and the third substrate carrier stage are disposed at different positions in plan view.

APPENDIX 4

The substrate transfer system of appendix 2 or 3, further comprising:
a fourth load port disposed above the second load port and extending outward from the third sidewall along the first direction,
wherein the fourth load port includes a fourth substrate carrier stage, and
the second substrate carrier stage and the fourth substrate carrier stage are disposed at different positions in plan view.

APPENDIX 5

A transfer module comprising:
a housing; and
a transfer device disposed in the housing,
wherein the housing includes:
a first sidewall having a first opening communicating with a load-lock module; and
a second sidewall, which is different from a sidewall opposite to the first sidewall, connected to a load port and having at least one second opening.

APPENDIX 6

The transfer module of appendix 5, wherein said at least one second opening includes a plurality of second openings arranged along a horizontal direction.

APPENDIX 7

The transfer module of appendix 5 or 6, wherein the first opening and said at least one second opening are formed at different heights.

APPENDIX 8

The transfer module of appendix 7, wherein a surface of the first sidewall where the first opening is formed protrudes toward a region of the second sidewall when viewed from a direction intersecting the surface of the second sidewall.

APPENDIX 9

The transfer module of appendix 5, wherein said at least one second opening includes a plurality of second openings arranged along a longitudinal direction.

APPENDIX 10

The transfer module of appendix 9, wherein at least one of the plurality of second openings is formed at a position higher than the first opening, and at least another one of the plurality of second openings is formed at a position lower than the first opening.

APPENDIX 11

The transfer module of appendix 10, wherein the plurality of second openings are formed on a same plane.

APPENDIX 12

The transfer module of appendix 10 or 11, wherein another plurality of the second openings are additionally formed so as to be arranged in the horizontal direction along the surface of the second sidewall at the same height position as the position where the plurality of the second openings are formed.

APPENDIX 13

The transfer module of appendix 12, wherein the surface of the first sidewall where the first opening is formed protrudes toward the region of the second sidewall when viewed from a direction intersecting the surface of the second sidewall.

APPENDIX 14

The transfer module of any one of appendices 5 to 13, further comprising:
an aligner unit disposed in the housing.

APPENDIX 15

The transfer module of any one of appendices 5 to 14, further comprising:
a storage unit disposed in the housing.

APPENDIX 16

The transfer module of any one of appendices 5 to 15, further comprising:
a gas supply configured to supply and circulate an inert gas in the housing.

APPENDIX 17

A transfer module comprising:
a housing; and
a transfer device disposed in the housing,
wherein the housing includes:
a first sidewall having a first opening communicating with a load-lock module; and
a second sidewall, which is disposed along a plane including the first sidewall, connected to a load port and having at least one second opening.

The invention claimed is:
1. A substrate transfer system comprising:
a load-lock module;
an atmospheric transfer module including:
a first sidewall;
a second sidewall;
a third sidewall, the first sidewall extending along a first direction and connected to the load-lock module, the second sidewall extending along a second direction perpendicular to the first direction, and the third sidewall being disposed on an opposite side of the second sidewall;

a fourth sidewall opposite to the first sidewall;

a guide rail formed on the fourth sidewall and extending in a vertical direction; and a transfer robot moving vertically along the guide rail;

a first load port extending outward from the second sidewall along the first direction, the first load port including a first moving part configured to rotate a container placed thereon to change a direction of an opening of the container and to move the container to connect the container to the atmospheric transfer module; and a second load port extending outward from the third sidewall along the first direction, the second load port including a second moving part configured to rotate a container placed thereon to change a direction of an opening of the container and to move the container to connect the container to the atmospheric transfer module, wherein the atmospheric transfer module further includes an opening formed in the first sidewall and communicating with the load-lock module, the opening being disposed below the first load port and the second load port.

2. The substrate transfer system of claim 1, wherein the first moving part is a first substrate carrier stage, and the second moving part is a second substrate carrier stage.

3. The substrate transfer system of claim 2, further comprising:

a third load port disposed above the first load port and extending outward from the second sidewall along the first direction, the third load port including a third moving part configured to rotate a container placed thereon to change a direction of an opening of the container and to move the container to connect the container to the atmospheric transfer module, wherein the third moving part is a third substrate carrier stage, and the first substrate carrier stage and the third substrate carrier stage are disposed at different positions in plan view.

4. The substrate transfer system of claim 3, further comprising:

a fourth load port disposed above the second load port and extending outward from the third sidewall along the first direction, the fourth load port including a fourth moving part configured to rotate a container placed thereon to change a direction of an opening of the container and to move the container to connect the container to the atmospheric transfer module, wherein the fourth moving part is a fourth substrate carrier stage, and the second substrate carrier stage and the fourth substrate carrier stage are disposed at different positions in plan view.

5. The substrate transfer system of claim 1, wherein the first load port includes a guide rail on which the first moving part moves to connect the container to the atmospheric transfer module.

6. The substrate transfer system of claim 5, wherein the first moving part is configured to change the position and the direction of the container, which is disposed such that the opening is along a sidewall surface, so that the opening of the container faces the opening of the atmospheric transfer module.

7. The substrate transfer system of claim 1, further comprising storage disposed below the atmospheric transfer module offset from a main travel path of a guiderail and disposed beneath the second load port.

8. The substrate transfer system of claim 1, wherein the atmospheric transfer module further includes an alignment chamber including an aligner for adjusting a direction of a substrate disposed in the alignment chamber, and the transfer robot moves vertically in the atmospheric transfer module to transfer the substrate between the first load port and the second load port, the alignment chamber and the load-lock module.

9. A transfer module comprising:

a housing;

storage disposed near a bottom of the housing;

an alignment chamber including an aligner for adjusting a direction of a substrate a guide rail extending in a vertical direction; and a transfer device disposed in the housing and movable along the guide rail, wherein the housing includes:

a first sidewall having a first opening communicating with a load-lock module;

a second sidewall connected to a first load port and having at least one second opening;

a third sidewall opposite to the second sidewall, connected to a second load port, and having at least one third opening; and a fourth sidewall opposite to the first sidewall, wherein the guide rail is formed on the fourth sidewall and extends in a vertical direction, wherein the first opening is disposed below the first load port and the second load port, and wherein the first load port and the second load port are disposed above the storage.

10. The transfer module of claim 9, wherein said at least one second opening includes a plurality of second openings arranged along a horizontal direction.

11. The transfer module of claim 9, wherein the first opening and said at least one second opening are formed at different heights.

12. The transfer module of claim 11, wherein a surface of the first sidewall where the first opening is formed protrudes toward a region of the second sidewall when viewed from a direction intersecting the surface of the second sidewall.

13. The transfer module of claim 9, wherein said at least one second opening includes a plurality of second openings arranged along a longitudinal direction.

14. The transfer module of claim 13, wherein at least one of the plurality of second openings is formed at a position higher than the first opening, and at least another one of the plurality of second openings is formed at a position lower than the first opening.

15. The transfer module of claim 14, wherein the plurality of second openings are formed on a same plane.

16. The transfer module of claim 14, wherein another plurality of the second openings are additionally formed so as to be arranged in a horizontal direction along the surface of the second sidewall at the same height position as the position where the plurality of the second openings are formed.

17. The transfer module of claim 16, wherein the surface of the first sidewall where the first opening is formed protrudes toward a region of the second sidewall when viewed from a direction intersecting the surface of the second sidewall.

18. The transfer module of claim 9, further comprising:

a gas supply for supplying and circulating an inert gas in
the housing.

19. The transfer module of claim 9, further comprising
storage disposed below the atmospheric transfer module
offset from a main travel path of the guiderail and disposed
beneath the second load port.

\* \* \* \* \*